(12) United States Patent
Iwashita et al.

(10) Patent No.: US 8,854,156 B2
(45) Date of Patent: Oct. 7, 2014

(54) THIN-FILM PIEZOELECTRIC RESONATOR AND THIN-FILM PIEZOELECTRIC FILTER USING THE SAME

(75) Inventors: Kazuki Iwashita, Yamaguchi (JP); Hiroshi Tsuchiya, Yamaguchi (JP); Kensuke Tanaka, Yamaguchi (JP); Takuya Maruyama, Yamaguchi (JP)

(73) Assignee: UBE Industries, Ltd., Yamaguchi (JP)

( * ) Notice: Subject to any disclaimer, the term of this patent is extended or adjusted under 35 U.S.C. 154(b) by 601 days.

(21) Appl. No.: 13/202,442

(22) PCT Filed: Feb. 17, 2010

(86) PCT No.: PCT/JP2010/052336
§ 371 (c)(1),
(2), (4) Date: Aug. 19, 2011

(87) PCT Pub. No.: WO2010/095640
PCT Pub. Date: Aug. 26, 2010

(65) Prior Publication Data
US 2011/0298564 A1 Dec. 8, 2011

(30) Foreign Application Priority Data

Feb. 20, 2009 (JP) .................. 2009-037853
Mar. 31, 2009 (JP) .................. 2009-085613

(51) Int. Cl.
*H03H 9/15* (2006.01)
*H03H 9/54* (2006.01)
*H03H 9/17* (2006.01)
*H03H 9/02* (2006.01)
*H03H 9/60* (2006.01)
*H03H 3/02* (2006.01)

(52) U.S. Cl.
CPC .......... *H03H 9/173* (2013.01); *H03H 9/02086* (2013.01); *H03H 9/605* (2013.01); *H03H 3/02* (2013.01); *H03H 9/02133* (2013.01); *H03H 9/02149* (2013.01); *H03H 9/174* (2013.01)
USPC ............ 333/187; 333/189; 333/190; 310/312

(58) Field of Classification Search
CPC ............ H03H 9/02086; H03H 9/0211; H03H 9/02118; H03H 9/173; H03H 9/174; H03H 9/175; H03H 9/587; H03H 9/588; H03H 9/589; H03H 9/605
USPC .................. 333/187–192; 310/312
See application file for complete search history.

(56) References Cited

U.S. PATENT DOCUMENTS

| | | | |
|---|---|---|---|
| 6,788,170 B1 | 9/2004 | Kaitila et al. | |
| 6,812,619 B1 | 11/2004 | Kaitila et al. | |
| 7,432,785 B2 * | 10/2008 | Yoon et al. | 333/189 |
| 7,598,826 B2 * | 10/2009 | Yamaguchi et al. | 333/187 |
| 2005/0099094 A1 * | 5/2005 | Nishihara et al. | 310/324 |
| 2006/0244552 A1 * | 11/2006 | Park et al. | 333/189 |
| 2008/0227240 A1 * | 9/2008 | Sharma et al. | 438/113 |
| 2009/0001848 A1 * | 1/2009 | Umeda et al. | 310/312 |
| 2009/0261922 A1 * | 10/2009 | Umeda | 333/189 |
| 2010/0134210 A1 * | 6/2010 | Umeda | 333/189 |

FOREIGN PATENT DOCUMENTS

| | | |
|---|---|---|
| JP | 11-340775 A | 12/1999 |
| JP | 2002-140075 A | 5/2002 |
| JP | 2005-236337 A | 9/2005 |
| JP | 3735777 B | 11/2005 |
| JP | 2006-109472 A | 4/2006 |
| JP | 2006-311181 A | 11/2006 |
| JP | 2008-182543 A | 8/2008 |
| JP | 2008-288819 A | 11/2008 |
| WO | WO 2008/090651 * | 7/2008 |
| WO | WO 2009/013938 * | 1/2009 |

OTHER PUBLICATIONS

English language machine translation of JP 11-340775, published on Dec. 10, 1999.*
English language machine translation of JP 2008-182543, published on Aug. 7, 2008.*

* cited by examiner

*Primary Examiner* — Barbara Summons
(74) *Attorney, Agent, or Firm* — Frommer Lawrence & Haug LLP; Ronald R. Santucci X-X Cross-section

(57) ABSTRACT

A thin-film piezoelectric resonator including a substrate (6); a piezoelectric layer (2), a piezoelectric resonator stack (12) with a top electrode (10) and bottom electrode (8), and a cavity (4). The piezoelectric resonator stack (12) has a vibration region (40) where the top electrode and bottom electrode overlap in the thickness direction, and the vibration region comprises a first vibration region, second vibration region, and third vibration region. When seen from the thickness direction, the first vibration region is present at the outermost side, the third vibration region is present at the innermost side and does not contact the first vibration region, and the second vibration region is interposed between the first vibration region and third vibration region. The resonance frequency of the primary thickness-longitudinal vibration of the vibration region (40) is $f_1$ at the first vibration region, is $f_2$ at the third vibration region, wherein $f_1$ and $f_2$ satisfy a relationship of $f_1 < f_2$, and is a value between $f_1$ and $f_2$ at the second vibration region, said value increasing from the outer portion contacting the first vibration region to the inner portion contacting the third vibration region.

20 Claims, 28 Drawing Sheets

X-X Cross-section

Y-Y Cross-section

X-X Cross-section

Y-Y Cross-section

X-X Cross-section

Y-Y Cross-section

X-X Cross-section

Y-Y Cross-section

X-X Cross-section

Y-Y Cross-section

X-X Cross-section

X-X Cross-section

X-X Cross-section

Y-Y Cross-section

THIN-FILM PIEZOELECTRIC RESONATOR AND THIN-FILM PIEZOELECTRIC FILTER USING THE SAME

This application is a 371 of PCT/JP2010/052336 filed on Feb. 17, 2010, published on Aug. 26, 2010 under publication number WO 2010/095640 A which claims priority benefits from Japanese Patent Application No. 2009-037853 filed Feb. 20, 2009 and Japanese Patent Application No. 2009-085613 filed Mar. 31, 2009, the disclosures of which are incorporated herein by reference.

TECHNICAL FIELD

The present invention relates to a thin-film piezoelectric resonator and a thin-film piezoelectric filter using the same and, more particularly, to a thin-film piezoelectric resonator having a high quality factor (Q-value) and suppressing occurrence of noise and a thin-film piezoelectric filter using the same. The thin-film piezoelectric resonator and the thin-film piezoelectric filter are used to constitute a communication device such as a cellular phone.

BACKGROUND ART

Miniaturization is always required in the design of an RF circuit of a cellular phone. In recent years, the cellular phone is required to implement various functions and, to this end, it is preferable to incorporate as many components as possible in the device. However, there is a limitation in the size of the cellular phone, which makes it difficult to reduce the occupying area (mounting area) and height dimension of the RF circuit within the cellular phone. Thus, the components constituting the RF circuit are required to be small in terms of the occupying area and height dimension.

Under such circumstances, a thin-film piezoelectric filter formed using a thin-film piezoelectric resonator which is compact and capable of reducing weight has come to be utilized as a band-pass filter used in the RF circuit. The thin-film piezoelectric filter as mentioned above is an RF filter using a thin-film piezoelectric resonator (Thin Film Bulk Acoustic Resonator: FBAR) having a structure in which a piezoelectric thin-film made of aluminum nitride (AlN), zinc oxide (ZnO) or the like is formed on a semiconductor substrate in a sandwiched manner between top and bottom electrodes, and a cavity is formed immediately under the piezoelectric thin-film so as to prevent an elastic wave energy from propagating into the semiconductor substrate.

FIGS. 17A to 17C illustrate an example of a conventional thin-film piezoelectric resonator. FIG. 17A is a schematic plan view of the conventional thin-film piezoelectric resonator, FIG. 17B is a cross-sectional view taken along X-X line of FIG. 17A, and FIG. 17C is a cross-sectional view taken along Y-Y line of FIG. 17A. The thin-film piezoelectric resonator illustrated in FIGS. 17A to 17C has a substrate 6 having an air gap 4 thereon and a piezoelectric resonator stack 12 suspended from the substrate 6 with the peripheral portion thereof supported by an edge portion on the top surface of the substrate 6 near the air gap 4. The piezoelectric resonator stack 12 has a piezoelectric thin-film 2 and bottom and top electrodes 8 and 10 formed so as to sandwich the piezoelectric thin-film 2. Hereinafter, layers of the piezoelectric thin-film, bottom electrode, and top electrode are sometimes referred to as a piezoelectric body layer (piezoelectric layer), a bottom electrode layer, and a top electrode layer, respectively.

The piezoelectric resonator stack 12 is a laminated body of the piezoelectric layer 2, bottom electrode layer 8, and top electrode layer 10 and is suspended at the peripheral portion thereof, and both main surfaces in the center portion (portion corresponding to the air gap 4) contact a surrounding gas such as air, or vacuum. In this case, the piezoelectric resonator stack 12 forms an acoustic wave resonator having a high Q-value. An AC signal added to the bottom electrode layer 8 and top electrode layer 10 has a frequency equal to a value obtained by dividing the acoustic velocity in the piezoelectric resonator stack 12 by twice the weighted thickness of the piezoelectric resonator stack 12. That is, in the case where $fr=v/2t_0$ (fr is resonance frequency, v is acoustic velocity in the piezoelectric resonator stack 12, and $t_0$ is weighted thickness of the piezoelectric resonator stack 12) is satisfied, the piezoelectric resonator stack 12 resonates by the AC signal. Since the acoustic velocity in each layer constituting the piezoelectric resonator stack 12 changes for each material constituting each layer, the resonance frequency of the piezoelectric resonator stack 12 is determined not by the physical thickness of the stack 12 but by the weighted thickness calculated by taking into account the acoustic velocities of the piezoelectric layer 2, bottom electrode layer 8, and top electrode layer 10 and their physical thicknesses. A vibration region where the resonance of the piezoelectric resonator stack 12 occurs is a region where the top electrode 10 and bottom electrode 8 overlap each other when viewed in the thickness direction.

It is known that characteristic degradation occurs due to a lateral acoustic mode in a conventional thin-film piezoelectric resonator in the case where the resonator is formed into a quadrangle or circle.

PTL 1 discloses a technique for preventing occurrence of the characteristic degradation due to the unnecessary lateral acoustic mode (spurious vibration). FIGS. 18A and 18B each illustrate a cross-sectional view of a thin-film piezoelectric resonator disclosed in PTL 1. In this technique, a frame-like zone 60 is provided at the end portion (peripheral portion) of the top electrode so as to prevent occurrence of noise caused due to the lateral acoustic mode. FIG. 18A illustrates a structure adopted in the case where the piezoelectric layer is made of a piezoelectric material of type 1, such as ZnO, having a dispersion curve of a low frequency cutoff type, and FIG. 18B illustrates a structure adopted in the case where the piezoelectric layer is made of a piezoelectric material of type 2, such as AlN, having a dispersion curve of a high frequency cutoff type.

Further, increases in a quality factor (Q-value) and an electromechanical coupling factor ($kt^2$) are required as important characteristics of the thin-film piezoelectric resonator. When the Q-value is increased, the insertion loss of an FBAR filter can be reduced, so that the increase in the Q-value is a very important factor for the thin-film piezoelectric resonator. Further, the $kt^2$ is a factor determining the frequency interval between the resonance frequency of the thin-film piezoelectric resonator and its antiresonance frequency. When the $kt^2$ is increased, the passband width of the FBAR filter can be widened.

FIGS. 19A and 19B illustrate an example of an impedance characteristic diagram of a thin-film piezoelectric resonator and an example of a Smith chart of a thin-film piezoelectric resonator, respectively. An impedance (Rs) and Q-value (Qs) at a resonance frequency (fs) and an impedance (Rp) and Q-value (Qp) at an antiresonance frequency (fp) are main characteristic parameters. In order to increase the Q-value at the resonance frequency fs and antiresonance frequency fp, Rs is needs to be reduced and Rp needs to be increased. In the Smith chart of FIG. 19B, the left end of the chart indicates the resonance frequency (fs) and right end indicates the antiresonance frequency (fp). In the frequency band (upper half of the from the fs to fp, a curve closer to the outer circumference of the chart exhibits better characteristics of the thin-film piezoelectric resonator. In the thin-film piezoelectric resonator, the Rs depends greatly on the electric resistance of an electrode, and the Rp depends greatly on the thermal loss of elastic energy and energy loss caused due to propagation of an elastic wave energy to outside the vibration region.

PTL 2 describes that an AlN thin-film is used to introduce a structure having an top electrode with an increased thickness on the frame formed at the outer periphery of the vibration region and, thereby, a thin-film piezoelectric resonator capable of suppressing occurrence of the spurious vibration and excellent in the Q-value can be obtained.

PTL 3 discloses a thin-film piezoelectric resonator having an annulus located on the surface of one of top and bottom electrodes. A region inside the annulus has a first acoustic impedance, the annulus has a second acoustic impedance, and a region outside the annulus has a third acoustic impedance. The second acoustic impedance is higher than the first and third acoustic impedances. PTL 3 describes that, with the above configuration, it is possible to obtain a thin-film piezoelectric resonator excellent in the Q-value.

The piezoelectric resonator stack constituted by the piezoelectric layer, bottom electrode, and top electrode is formed above the cavity, so that it is fragile in structure and is subject to mechanical breakage in the production process. Thus, as described in PTL 4 and PTL 5, in order to prevent the breakage of the thin-film piezoelectric resonator, proposed is a configuration in which the cavity is covered with the bottom electrode, i.e., the bottom electrode is formed on the substrate in contact with the surface of the substrate.

When there exists a region where the top and bottom electrodes overlap each other outside the cavity, an unnecessary capacitance is generated to reduce an effective electromechanical coupling factor (effective $kt^2$). Therefore, it is proposed that the region where the top and bottom electrodes overlap each other be formed within the cavity.

CITATION LIST

Patent Literature

{PTL 1} Japanese Patent No. 3735777
{PTL 2} JP-A-2005-236337
{PTL 3} JP-A-2006-109472
{PTL 4} JP-A-2002-140075
{PTL 5} JP-A-2006-311181

SUMMARY OF INVENTION

Technical Problem

The technique disclosed in PTL 1 can suppress occurrence of the spurious vibration; however, a reduction in the Q-value unfavorably occurs as described in PTL 3.

The technique disclosed in PTL 2 can increase the Q-value of the thin-film piezoelectric resonator. However, in this technique, the outer peripheral portion of the vibration region and center portion thereof have different thicknesses, so that the resonance frequency of primary thickness longitudinal vibration is different in the outer peripheral portion and center portion. Thus, in the response to an RF signal of the thin-film piezoelectric resonator, a peak occurs due to originally unnecessary primary thickness longitudinal vibration in the outer peripheral portion of the vibration region, which may easily cause degradation of filter characteristics. In addition, the $kt^2$ is unfavorably reduced.

The technique disclosed in PTL 3 can increase the Q-value of the thin-film piezoelectric resonator. However, in this technique, the acoustic impedance in the outer peripheral portion (annulus) of the vibration region is made higher than those in the center portion and buffer region. That is, the thickness of the outer peripheral portion of the vibration region is made larger as in PTL 2, which poses the same problem as in PTL 2. In addition, it can be seen from the exemplary embodiment of PTL 3 that in a frequency lower than the resonance frequency (fs) in the primary thickness vibration mode, a spurious response caused due to another vibration mode becomes large.

As described above, the techniques of the related arts are insufficient to suppress occurrence of noise based on the spurious caused due to a different vibration mode required for the thin-film piezoelectric resonator or due to an unnecessary thickness longitudinal vibration mode and thereby to achieve a high Q-value and large $kt^2$, and there is a room for improvement in this point in the conventional techniques.

The present invention has been made in view of the above situations, and an object thereof is to provide a thin-film piezoelectric resonator suppressing occurrence of the spurious noise and having a high Q-value and large $kt^2$. Another object of the present invention is to provide a thin-film piezoelectric filter using the above thin-film piezoelectric resonator.

Meanwhile, thin-film piezoelectric filters are required to suppress spurious characteristics appearing in the passband and to achieve low insertion loss. To this end, the thin-film piezoelectric resonator is required to suppress a lateral acoustic mode which is unnecessary vibration, to have a high Q-value, and to increase an effective electromechanical coupling factor (effective $kt^2$) which is a main parameter for determining the passband width of the thin-film piezoelectric filter. Further, in order to achieve an increase in manufacturing yield, a robust resonator structure in which breakage does not occur during a manufacturing process is required.

Although the positional relationship between the cavity and bottom electrode or positional relationship between the cavity and vibration region where the bottom and top electrodes overlap each other through the piezoelectric layer are discussed in the above-mentioned related arts, a detailed positional relationship among components or the size of the components are not sufficiently discussed, and there is a room for improvement in order to obtain a robust and satisfactory resonator characteristics.

The present invention has been made in view of the above situation, and an object thereof is to provide a thin-film piezoelectric resonator having a large effective $kt^2$ and a high Q-value, as well as, a robust structure with less breakage.

Solution to Problem

According to the present invention, in order to achieve any of the above objects, there is provided a thin-film piezoelectric resonator including: a substrate; a piezoelectric resonator stack formed on the substrate and having a piezoelectric layer and top and bottom electrodes formed so as to face each other through the piezoelectric layer; and a cavity or an acoustic reflection layer formed between the substrate and piezoelectric resonator stack. The piezoelectric resonator stack has a vibration region where the top and bottom electrodes overlap each other as viewed in the thickness direction of the piezoelectric resonator stack. The vibration region includes a first vibration region, a second vibration region, and a third vibration region. As viewed in the thickness direction of the piezoelectric resonator stack, the first vibration region is located at the outermost side, the third vibration region is located at the innermost side and does not contact with the first vibration region, and the second vibration region is interposed between the first vibration region and third vibration region. The resonance frequency of the primary thickness longitudinal vibration of the vibration region is $f_1$ in the first vibration region, is $f_2$ in the third vibration region, wherein $f_1$ and $f_2$ satisfy a relationship of $f_1<f_2$, and is a value between $f_1$ and $f_2$ in the second vibration region, the value increasing from the outer portion contacting the first vibration region to the inner portion contacting the third vibration region. With the above configuration, a thin-film piezoelectric resonator capable of suppressing occurrence of noise based on the spurious caused due to a different vibration mode or due to an unnecessary thickness longitudinal vibration and having a high Q-value and a large $kt^2$ can be provided.

Preferably, in the above configuration, the piezoelectric resonator stack has different thicknesses in the first vibration region, second vibration region, and third vibration region.

Preferably, in the above configuration, the piezoelectric resonator stack has a frame layer additionally formed on the top electrode in the outer peripheral portion of the vibration region.

Preferably, in the above configuration, the frame layer is reduced in thickness, in the second vibration region, from the outer part contacting the first vibration region toward the inner part contacting the third vibration region.

Preferably, in the above configuration, the frame layer has a sloped upper surface in the second vibration region, and the angle of the sloped upper surface with respect to the upper surface of the substrate is 60° or less.

Preferably, in the above configuration, the frame layer is formed of a material having a Young's modulus of $1.0 \times 10^{11}$ N/m$^2$ or more.

Preferably, in the above configuration, $Z_f$ and $Z_u$ satisfy a relationship of $0.5Z_u<Z_f<2Z_u$, where $Z_f$ is the acoustic impedance of the material of the frame layer, and $Z_u$ is the acoustic impedance of the material of the top electrode.

Preferably, in the above configuration, the top electrode or bottom electrode is reduced in thickness, in the second vibration region, from the outer part contacting the first vibration region toward the inner part contacting the third vibration region.

Preferably, in the above configuration, the top electrode or bottom electrode has a sloped upper surface in the second vibration region, and the angle of the sloped upper surface with respect to the upper surface of the substrate is 60° or less.

Preferably, in the above configuration, the top electrode or bottom electrode is formed of a material having a Young's modulus of $1.0 \times 10^{11}$ N/m$^2$ or more.

Preferably, in the above configuration, the width of the first vibration region is 3 µm or less.

Preferably, in the above configuration, the piezoelectric layer is formed of aluminum nitride.

Preferably, in the above configuration, the vibration region exists inside the outer peripheral edge of the cavity or acoustic reflection layer as viewed in the thickness direction of the piezoelectric resonator stack.

Preferably, in the above configuration, the piezoelectric resonator stack has a support region located outside the vibration region as viewed in the thickness direction of the piezoelectric resonator stack and a buffer region located between the vibration region and support region as viewed in the same direction and contacts the substrate in the support region.

Preferably, in the above configuration, the piezoelectric resonator stack has a frame layer additionally formed on the top electrode in the outer peripheral portion of the vibration region and the frame layer has a uniform thickness in the first vibration region, the buffer region and the support region. With this configuration, a thin-film piezoelectric resonators having a higher Q-value and a larger effective $kt^2$, as well as a lower resistance value at the resonance frequency can be provided.

Preferably, in the above configuration, the bottom electrode has, in the support region, a support portion extending along the boundary between the support region and buffer region, and the width w1 of the support portion and thickness t of the piezoelectric resonator stack in the vibration region satisfy a relationship of $2.17 \leq w1/t \leq 10$, and the width w2 of the buffer region and thickness t of the piezoelectric resonator stack in the vibration region satisfy a relationship of $0.25 \leq w2/t \leq 2$. With this configuration, a thin-film piezoelectric resonator having a large effective $kt^2$ and a high Q-value, as well as, an extremely robust structure can be achieved.

Preferably, in the above configuration, the support portion of the bottom electrode is formed so as not to overlap the top electrode and an external connection conductor connected to the top electrode as viewed in the thickness direction of piezoelectric resonator stack.

Preferably, in the above configuration, the vibration region has an ellipse shape.

Preferably, in the above configuration, the major axis dimension a and minor axis dimension b of the ellipse satisfy a relationship of $1<a/b \leq 1.9$. With this configuration, a thin-film piezoelectric resonator capable of suppressing occurrence of an unnecessary vibration mode and suppressing ripple generated in the passband of the thin-film piezoelectric filter can be achieved.

Preferably, in the above configuration, the piezoelectric resonator stack has a dielectric layer formed of at least one material selected from a group consisting of AlN, AlON, $Si_3N_4$ and SiAlON on the top electrode and/or under the bottom electrode. With this configuration, it is possible to protect the top electrode and/or bottom electrode to thereby achieve a thin-film piezoelectric resonator with an extremely robust structure having a large effective $kt^2$ and a high Q-value. Further, the formation of the dielectric layer under the bottom electrode increases the bearing capacity of the piezoelectric resonator stack, thereby achieving a thin-film piezoelectric resonator with a more robust structure.

Further, according to the present invention, in order to achieve any of the above objects, there is provided a thin-film piezoelectric filter using the thin-film piezoelectric resonator, in particular, a ladder-type filter or a lattice-type filter in which series thin-film piezoelectric resonators and parallel thin-film piezoelectric resonators are connected in a ladder or lattice pattern. In this filter, the thin-film piezoelectric resonator according to the present invention is used only as the parallel thin-film piezoelectric resonators. With this configuration, a thin-film piezoelectric filter capable of reducing noise in the passband to an extremely low level and reducing insertion loss in the passband can be provided.

Advantageous Effects of Invention

According to the present invention, a thin-film piezoelectric resonator capable of suppressing occurrence of noise based on the spurious caused due to a different vibration mode or due to an unnecessary thickness longitudinal vibration and having a high Q-value and a large $kt^2$ can be provided. Further, a thin-film piezoelectric filter capable of reducing noise in the passband to an extremely low level and reducing insertion loss in the passband can be provided.

Further, according to the present invention, a thin-film piezoelectric resonator having a large effective $kt^2$ and a high Q-value, as well as, an extremely robust structure can be achieved.

DESCRIPTION OF EMBODIMENTS

An exemplary embodiment of the present invention will be described with reference to the accompanying drawings.

Figure 1A:
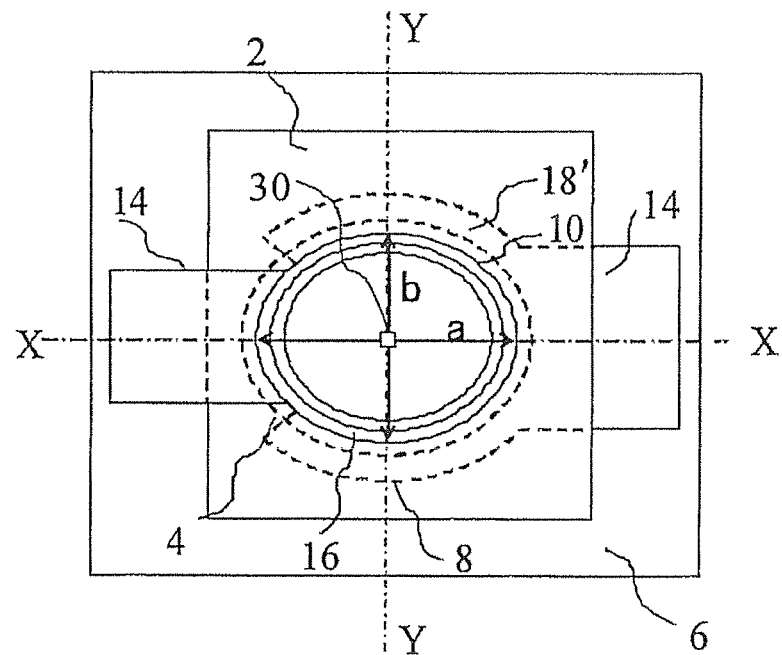
FIG. 1A A plan view schematically illustrating an exemplary embodiment of a thin-film piezoelectric resonator according to the present invention.
Figure 1B:
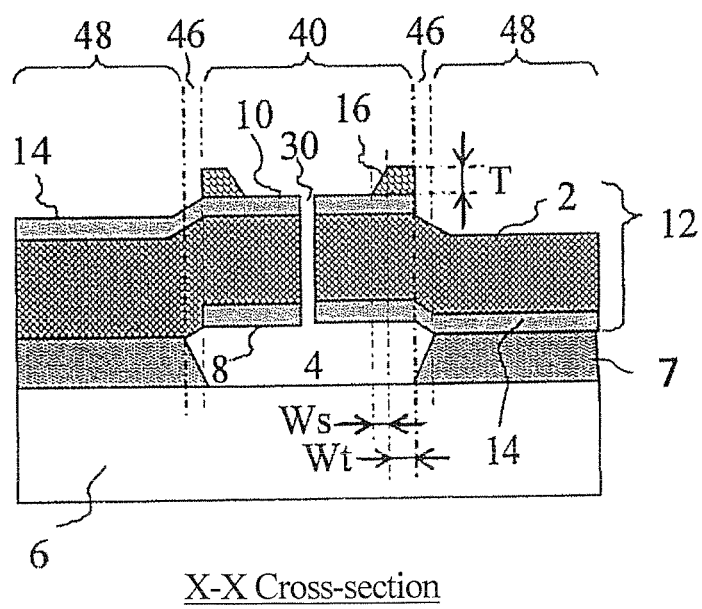
FIG. 1B A cross-sectional view taken along the line X-X of FIG. 1A.
Figure 1C:
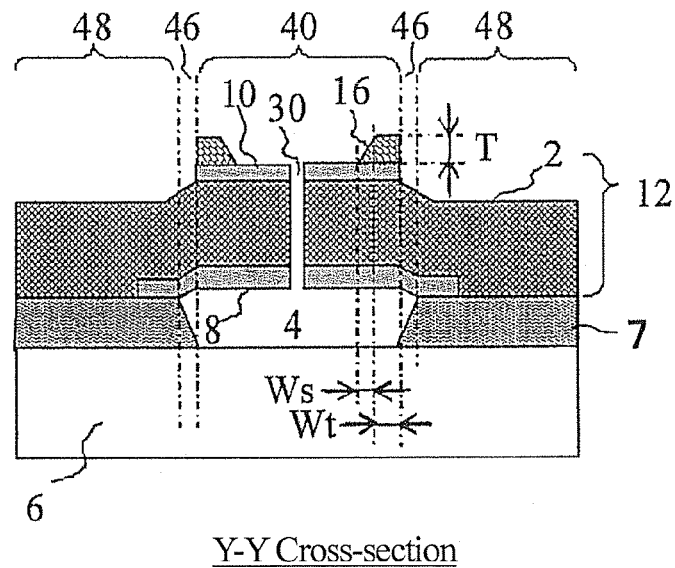
FIG. 1C A cross-sectional view taken along the line Y-Y of FIG. 1A.

FIG. 1A is a plan view schematically illustrating the exemplary embodiment of a thin-film piezoelectric resonator according to the present invention, FIG. 1B is a cross-sectional view taken along the line X-X of FIG. 1A, and FIG. 1C is a cross-sectional view taken along the line Y-Y of FIG. 1A. The thin film piezoelectric resonator includes a substrate 6 and a piezoelectric resonator stack 12. The substrate 6 has an insulating layer 7 formed as an upper layer thereof, that is, the substrate 6 includes the insulating layer 7. A cavity (air gap), i.e., a vibration space 4 is formed between the substrate 6 and piezoelectric resonator stack 12.

The piezoelectric resonator stack 12 is formed on the substrate 6, i.e., on the insulating layer 7 and has a piezoelectric thin film (piezoelectric layer) 2 and bottom and top electrodes 8 and 10 formed so as to face each other through the piezoelectric thin film in the film thickness direction. The outer shape (shape as viewed in the thickness direction of the piezoelectric resonator stack 12) of a part of the piezoelectric thin film 2 that is sandwiched between the top and bottom electrodes 8 and 10 is an ellipse. However, a connection conductor (external connection conductor) 14 which is a conductive thin film formed so as to connect the top and bottom electrodes 10 and 8 to an external circuit is not included in the shape mentioned above. The boundary between the connection conductor 14 and top electrode 10 or between the connection conductor 14 and bottom electrode 8 corresponds to a line obtained by extending the outer shape line of the top electrode 10 or bottom electrode 8.

The piezoelectric resonator stack 12 has a vibration region 40 where the top and bottom electrode 10 and 8 overlap each other as viewed in the thickness direction of the piezoelectric resonator stack. The piezoelectric resonator stack 12 further has a support region 48 located outside the vibration region 40 as viewed in the thickness direction of the piezoelectric resonator stack and a buffer region 46 located between the vibration region 40 and support region 48 as viewed in the same direction. The piezoelectric resonator stack 12 contacts the substrate 6 in the support region 48. The bottom electrode 8 has, in the support region 48, a support portion 18' extending along the boundary between the support region 48 and buffer region 46. As illustrated, the support portion 18' can be formed so as not to overlap the top electrode 10 and external connection conductor 14 connected to the top electrode 10 as viewed in the thickness direction of the piezoelectric resonator stack 12.

Figure 2:
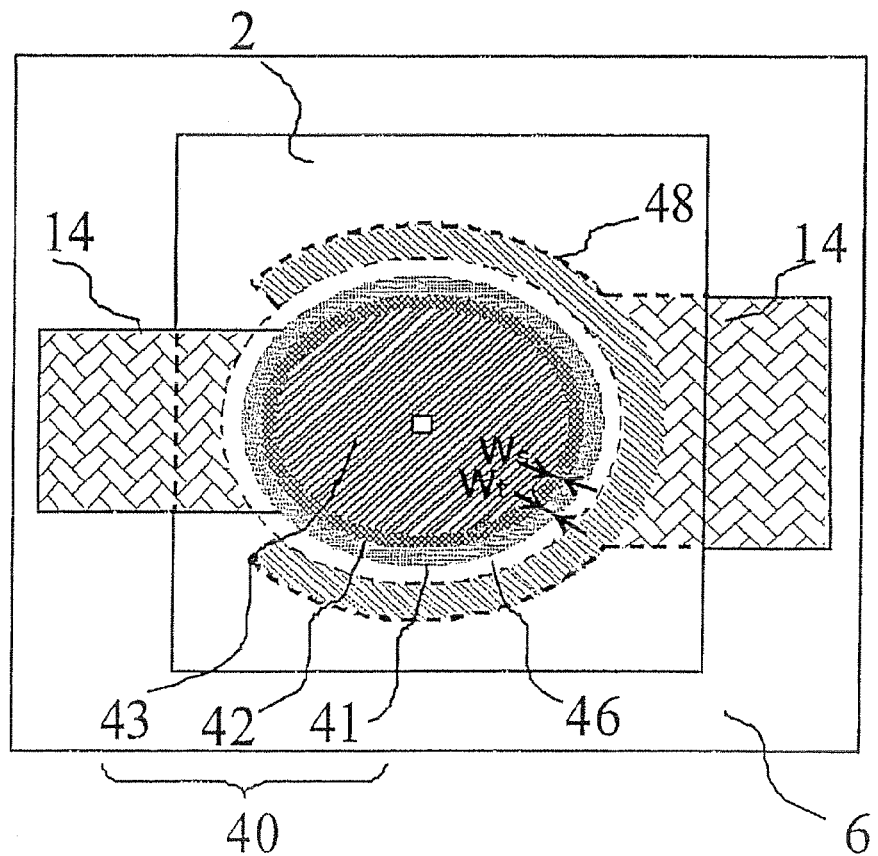
FIG. 2 A plan view schematically illustrating a vibration region, buffer region, and support region according to the exemplary embodiment of the thin-film piezoelectric resonator according to the present invention.

FIG. 2 is a plan view schematically illustrating the vibration region 40, buffer region 46, and support region 48 according to the present exemplary embodiment. As illustrated in FIG. 2, the vibration region 40 includes a first vibration region 41, a second vibration region 42, and a third vibration region 43. As viewed from the thickness direction of the piezoelectric resonator stack, the first vibration region 41 is located at the outermost side and contacts the buffer region 46, the third vibration region 43 is located at the innermost side and contacts neither the first vibration region nor the buffer region 46, and the second vibration region 42 is interposed between the first vibration region 41 and third vibration region 43. The width of the first vibration region 41 is Wt, and the width of the second vibration region 42 is Ws.

The resonance frequency of the primary thickness longitudinal vibration of the vibration region 40 is $f_1$ in the first vibration region 41, is $f_2$ in the third vibration region 43, wherein $f_1$ and $f_2$ satisfy a relationship of $f_1<f_2$, and is a value between $f_1$ and $f_2$ in the second vibration region 42, the value increasing from the outer portion contacting the first vibration region 41 to the inner portion contacting the third vibration region 43.

The above relationship of the primary thickness longitudinal vibration frequency can be achieved by making the thickness of the piezoelectric resonator stack 12 and/or the materials of the constituent layers different in the first, second, and third vibration regions 41, 42, and 43. Examples of approaches for realizing this aim include a method that varies the thickness of any of the bottom electrode 8, piezoelectric layer 2, and top electrode 10 constituting the vibration region 40 and/or the materials of the constituent layers from area to area of the vibration region 40 and a method that adds a layer constituting the piezoelectric resonator stack.

In the exemplary embodiment illustrated in FIGS. 1A to 1C, by adding a frame layer 16 on the top electrode 10, the above main feature of the present invention is realized. The frame layer 16 is formed on the top electrode 10 at the outer peripheral portion of the vibration region 40. The outer part of the frame layer 16 that contacts the buffer region 46 constitutes the first vibration region 41, and the inner part thereof constitutes the second vibration region 42. The frame layer 16 has a thickness T in the first vibration region 41. The cross-sectional shape (shape of the vertical cross-section passing through the center of the vibration region 40) of the inner part of the frame layer 16 that constitutes the second vibration region 42 has a slope. That is, as illustrated in FIGS. 1B and 1C, in the second vibration region 42, the frame layer 16 is gradually reduced in thickness from the outer part contacting the first vibration region 41 toward the inner part contacting the third vibration region 43. As a result, the upper surface of the frame layer 16 is inclined with respect to the upper surface of the substrate 6, that is, formed into a slope.

Figure 3A:
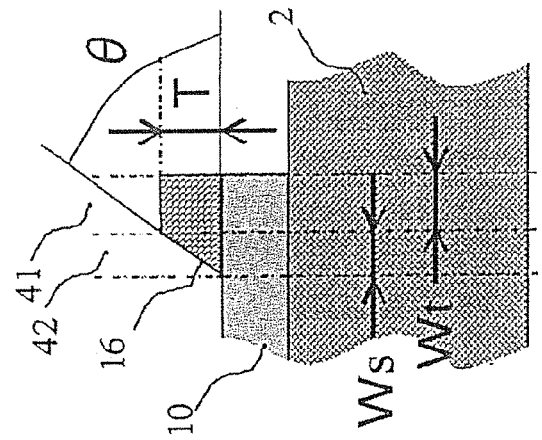
FIG. 3A A view schematically illustrating the cross-sectional shape of a frame layer according to the exemplary embodiment of the thin-film piezoelectric resonator according to the present invention.
Figure 3B:
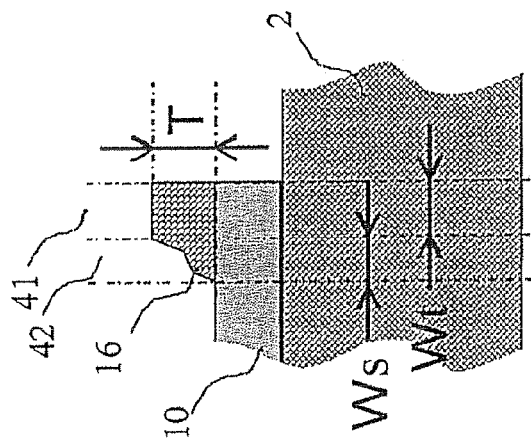
FIG. 3B A view schematically illustrating the cross-sectional shape of the frame layer according to the exemplary embodiment of the thin-film piezoelectric resonator according to the present invention.
Figure 3C:
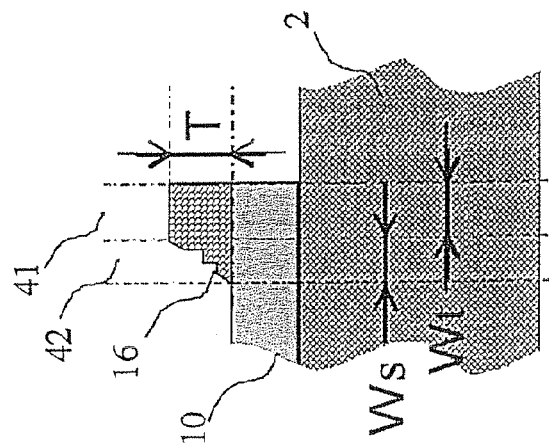
FIG. 3C A view schematically illustrating the cross-sectional shape of the frame layer according to the exemplary embodiment of the thin-film piezoelectric resonator according to the present invention.

FIGS. 3A to 3C each schematically illustrate the cross-sectional shape of the frame layer 16. In the exemplary embodiment illustrated in FIGS. 1A to 1C, the frame layer 16 has a vertical cross-sectional shape of a linear slope in the second vibration region 42, as illustrated in FIG. 3A. It is preferable that the angle (i.e., angle of the sloped upper surface of the frame layer 16 with respect to the upper surface of the substrate 6 in the second vibration region 42) θ of the slope is not less than 1° and not more than 60°. This is because when the angle θ is as extremely small as less than 1°, the width Ws of the second vibration region 42 becomes too large to achieve miniaturization of the resonator. In addition, the increase in the width Ws increases the difficulty in manufacturing of the resonator. On the other hand, when the angle θ is as extremely large as more than 60°, the width Ws of the second vibration region 42 becomes too small to achieve favorable resonator characteristics aimed in the present invention.

The vertical cross-sectional shape of the frame layer 16 according to the present invention in the second vibration region 42 is not limited to the above. For example, the vertical cross-section may have a curved slope as illustrated in FIG. 3B, a stepwise (polygonally shaped) slope as illustrated in FIG. 3C, or other shapes. In the case where the vertical cross-section of the frame layer 16 has a slope (curved, stepwise, or the like) other than the linear slope, the angle θ is obtained by straight-line approximation.

In place of forming the vertical cross-section of the frame layer 16 in the second vibration region 42 into a slope, the vertical cross-section of the top electrode 10 or bottom electrode 8 may be formed into a slope. In this case, the frame layer 16 is not added.

When the vertical cross-section of the top electrode 10, bottom electrode 8, or newly added frame layer 16 constituting the second vibration region 42 is formed into a slope, the resonance frequency of the primary thickness longitudinal vibration in the second vibration region 42 gradually changes (increases) within the range between $f_1$ and $f_2$ from the outer part contacting the first vibration region 41 toward the inner part contacting the third vibration region 43. In the case of the linear slope as illustrated in FIG. 3A, the resonance frequency of the primary thickness longitudinal vibration in the second vibration region 42 monotonously increases from the outer part contacting the first vibration region 41 toward the inner part contacting the third vibration region 43 according to the angle θ of the slope. In the case of the stepwise slope as illustrated in FIG. 3C, the resonance frequency of the primary thickness longitudinal vibration in a horizontal part of the step has a constant value.

By configuring the piezoelectric resonator stack 12 as described above and, in particular, by making the resonance frequency of the primary thickness longitudinal vibration in the second vibration region 42 gradually increase from the outer part contacting the first vibration region 41 toward the inner part contacting the third vibration region 43, occurrence of noise based on the spurious caused due to a different vibration mode or due to an unnecessary thickness longitudinal vibration is suppressed, whereby an excellent thin-film piezoelectric resonator having a high Q-value can be obtained.

As materials of the components constituting the thin-film piezoelectric resonator according to the present invention, the same materials as used for conventional thin-film piezoelectric resonators may be used. For example, the substrate 6 is formed of a silicon substrate, a gallium arsenide substrate, or a glass substrate. The piezoelectric thin film (piezoelectric layer) 2 is formed of a piezoelectric material capable of being produced as a thin film, such as zinc oxide (ZnO) or aluminum nitride (AlN), and is preferably formed of aluminum nitride exhibiting a dispersion curve of a high frequency cutoff type. The bottom electrode 8 and top electrode 10 are each formed of a metal material capable of being produced as a thin film, such as molybdenum, tungsten, ruthenium, platinum, or aluminum.

The thin-film piezoelectric resonator of the exemplary embodiment illustrated in FIGS. 1A to 1C can be produced as follows.

The insulating layer 7 is formed on the semiconductor substrate 6 such as a silicon substrate using a film formation technique such as sputtering or CVD method. In the case where the insulating layer is formed of $SiO_2$, a thermal oxidation process may be used for formation of the insulating layer 7. After that, a sacrificial layer which is easily dissolved in etching solution (etchant) is formed using a film formation technique such as sputtering or vapor deposition, and patterning is applied, using a patterning technique such as wet etching, RIB, or lift-off, such that the sacrificial layer remains at a portion where the vibration space 4 is to be formed. The sacrificial layer may be a metal such as germanium (Ge), aluminum (Al), titanium (Ti), magnesium (Mg) or oxide thereof. Thereafter, the bottom electrode 8, piezoelectric layer 2, and top electrode 10 are formed using a film formation technique such as sputtering or vapor deposition and, patterning is applied to the respective layers using a patterning technique such as wet etching, RIE or lift-off.

Subsequently, the frame layer 16 is formed and patterned. At this time, the patterning is performed such that the frame layer 16 is formed in the outer peripheral portion of the vibration region 40, and that the upper surface (also referred to as end surface) of the frame layer 16 on the center side (inner side) of the vibration region 40 has a slope, to thereby form the second vibration region 42. A region where the thickness of the frame layer 16 outside the second vibration region 42 is uniform is defined as the first vibration region 41. As a method for forming the sloped shape, a patterning technique such as lift-off or RIE is preferable.

Figure 4A:
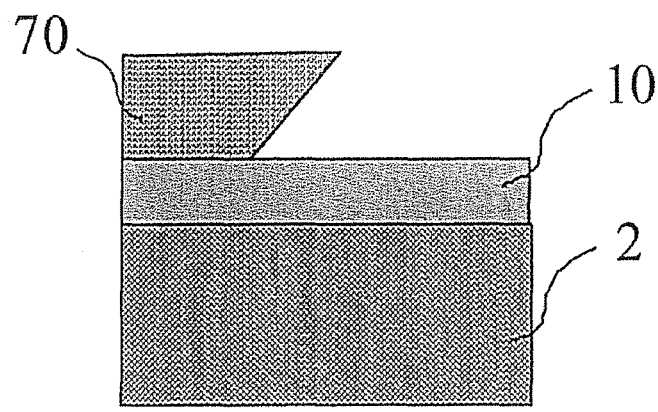
FIG. 4A A view schematically illustrating a state where the frame layer having a sloped end surface according to the exemplary embodiment of the thin-film piezoelectric resonator according to the present invention is formed using lift-off process.
Figure 4B:
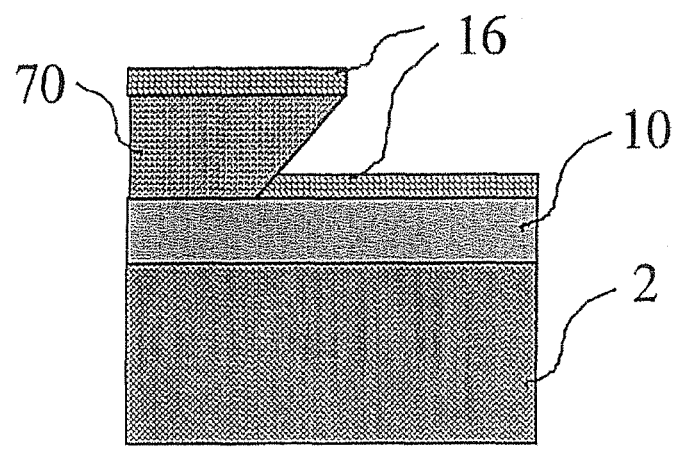
FIG. 4B A view schematically illustrating a state where the frame layer having a sloped end surface according to the exemplary embodiment of the thin-film piezoelectric resonator according to the present invention is formed using lift-off process.
Figure 4C:
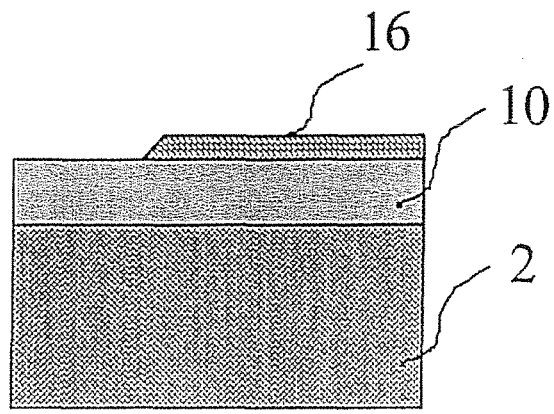
FIG. 4C A view schematically illustrating a state where the frame layer having a sloped end surface according to the exemplary embodiment of the thin-film piezoelectric resonator according to the present invention is formed using lift-off process.

FIGS. 4A to 4C schematically illustrate a state where the frame layer 16 having a sloped end surface according to the present exemplary embodiment is formed using lift-off process. In this case, a negative resist is mainly used to control an exposure condition, whereby a resist film 70 having a reverse-tapered slope as illustrated in FIG. 4 is formed. Thereafter, film formation of the frame layer 16 is performed (state illustrated in FIG. 4B), and then a remover is used to remove the resist film 70, whereby the frame layer 16 having a sloped end surface as illustrated in FIG. 4C can be formed.

Figure 5A:
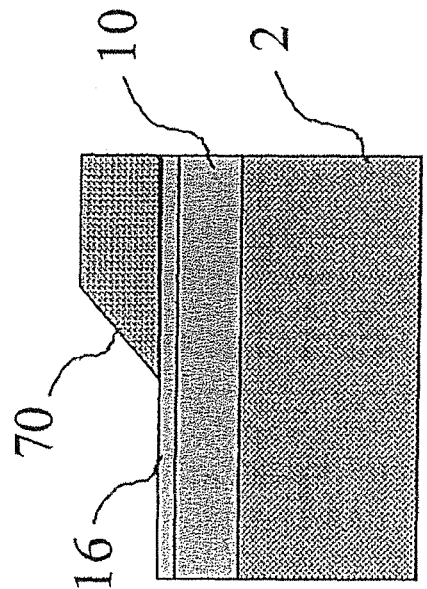
FIG. 5A A view schematically illustrating a state where the frame layer having a sloped end surface according to the exemplary embodiment of the thin-film piezoelectric resonator according to the present invention is formed using RIE process.
Figure 5B:
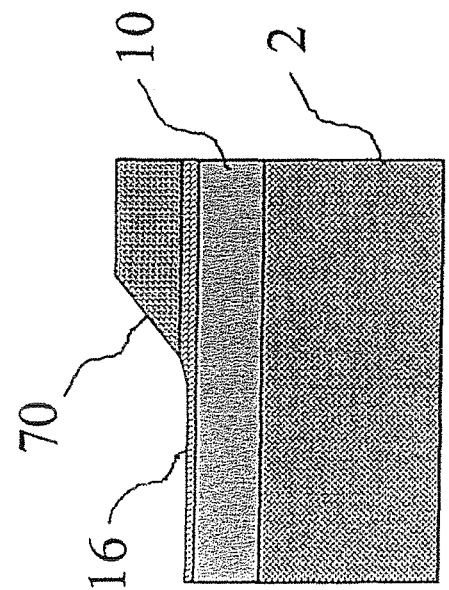
FIG. 5B A view schematically illustrating a state where the frame layer having a sloped end surface according to the exemplary embodiment of the thin-film piezoelectric resonator according to the present invention is formed using RIE process.
Figure 5C:
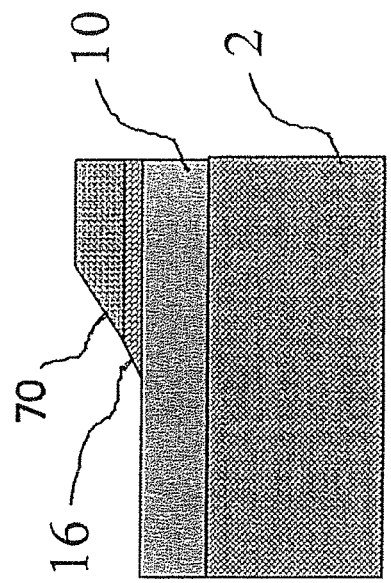
FIG. 5C A view schematically illustrating a state where the frame layer having a sloped end surface according to the exemplary embodiment of the thin-film piezoelectric resonator according to the present invention is formed using RIE process.
Figure 5D:
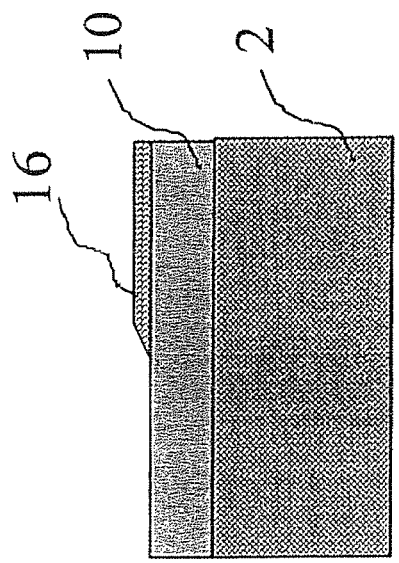
FIG. 5D A view schematically illustrating a state where the frame layer having a sloped end surface according to the exemplary embodiment of the thin-film piezoelectric resonator according to the present invention is formed using RIE process.

FIGS. 5A to 5D schematically illustrate a state where the frame layer 16 having a sloped end surface according to the present exemplary embodiment is formed using RIE process. In this case, after completion of the film formation of the frame layer 16, exposure and development conditions are selected such that the end portion of the resist film 70 has a sloped shape, and then the resist film 70 having a sloped end surface is formed as illustrated in FIG. 5A. Further, as illustrated in FIGS. 5B and 5C, by adding $O_2$ gas as an etching gas, the frame layer 16 is etched and, further, the end portion of the resist film 70 is etched to be gradually recessed. As a result, the frame layer 16 having the sloped end surface as illustrated in FIG. 5D can be formed.

Thereafter, patterning is applied, using a patterning technique such as RIE, to the frame layer 16 according to the outer peripheral shape of the top electrode 10, thereby obtaining the frame layer 16 in which the end surface (outer end surface) thereof at the peripheral portion is not formed into a slope. Subsequently, the through hole 30 is formed so as to extend from the upper surface of the top electrode 10 to the sacrificial layer using the above-mentioned patterning technique, and the sacrificial layer is removed by means of etching solution supplied through the through hole 30. Further, etching solution capable of etching the insulating layer 7 is selected, followed by etching of the insulating layer 7 by means of the etching solution, whereby the insulating layer 7 is etched with the same pattern as that of the sacrificial layer. Thus, the vibration space (air gap, i.e., cavity) 4 is formed at the portion where the sacrificial layer and insulating layer 7 have been removed. By forming the bottom electrode 8 to be larger in size than the sacrificial layer by a predetermined dimension and the top electrode 10 to be smaller than the sacrificial layer by a predetermined dimension, the buffer region 46 is formed on the air gap 4, and the support region 48 is formed on the insulating layer 7 of the substrate 6. The vibration region 40 exists inside the outer peripheral edge of the cavity 4 as viewed in the thickness direction of the piezoelectric resonator stack 12.

Figure 6A:
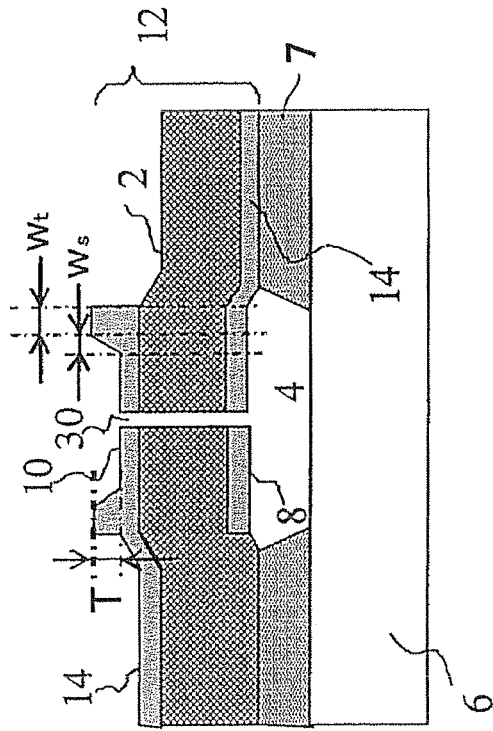
FIG. 6A An X-X cross-sectional view illustrating another exemplary embodiment of the thin-film piezoelectric resonator according to the present invention.
Figure 6B:
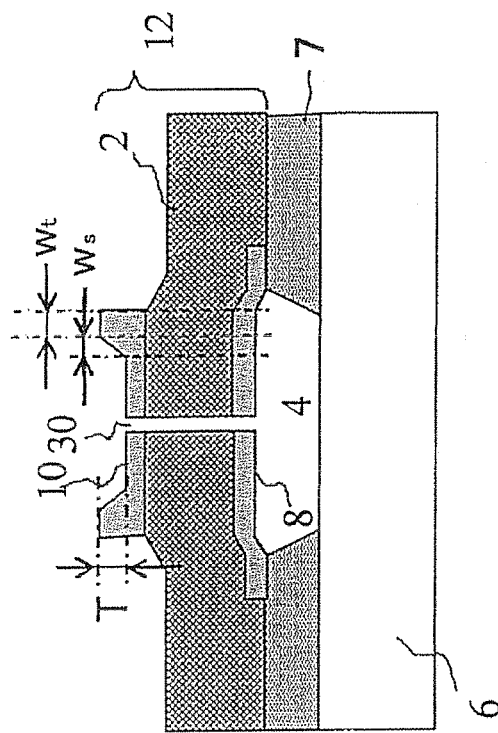
FIG. 6B A Y-Y cross-sectional view illustrating the exemplary embodiment of FIG. 6A.

FIG. 6A is an X-X cross-sectional view illustrating another exemplary embodiment of the thin-film piezoelectric resonator according to the present invention, and FIG. 6B is a Y-Y cross-sectional view illustrating the exemplary embodiment of FIG. 6A. The present exemplary embodiment differs from the exemplary embodiment illustrated in FIGS. 1A to 1C and the like only in the formation method of the first vibration region 41, second vibration region 42, and third vibration region 43. That is, in the present exemplary embodiment, the frame layer 16 is not formed but the thickness of the top electrode 10 is made to vary from area to area to thereby form the first vibration region 41, second vibration region 42, and third vibration region 43 in the vibration region 40. The thickness of the top electrode 10 in the first vibration region 41 is larger by T than that of the top electrode 10 in the third vibration region 43. In the second vibration region 42, the thickness of the top electrode 10 is reduced from the outer part contacting the first vibration region 41 toward the inner part contacting the third vibration region 43. As a result, the upper surface of the top electrode 10 is inclined with respect to the upper surface of the substrate 6 in the second vibration region 42, that is, formed into a slope.

The thin-film piezoelectric resonator of the exemplary embodiment illustrated in FIGS. 6A and 6B can be produced as follows. The procedure for forming the part from the insulating layer to piezoelectric layer is the same as that described in the exemplary embodiment illustrated in FIGS. 1A to 1C and the like. The top electrode 10 is formed using a film formation technique such as sputtering, vapor deposition, or CVD method. Thereafter, a part of the top electrode 10 other than the first and second vibration regions 41 and 42 is etched to be removed by a predetermined amount using an etching technique such as RIB. At this time, the processing is performed using the above-mentioned RIE method such that the cross-section of the part corresponding to the second vibration region has a slope. Then, a patterning technique such as wet etching or RIE is used to apply patterning so as to form the top electrode 10 into a predetermined outer shape. Thereafter, as in the case of the exemplary embodiment illustrated in FIGS. 1A to 1C and the like, the through hole 30 is formed so as to extend from the upper surface of the top electrode to the sacrificial layer, and the sacrificial layer and a part of the insulating layer are removed by means of etching solution so as to form the vibration space 4.

Figure 7A:
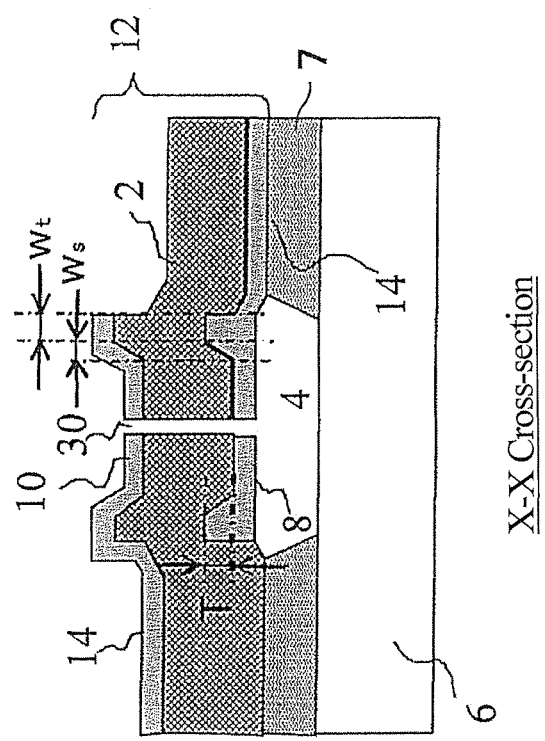
FIG. 7A An X-X cross-sectional view illustrating another exemplary embodiment of the thin-film piezoelectric resonator according to the present invention.
Figure 7B:
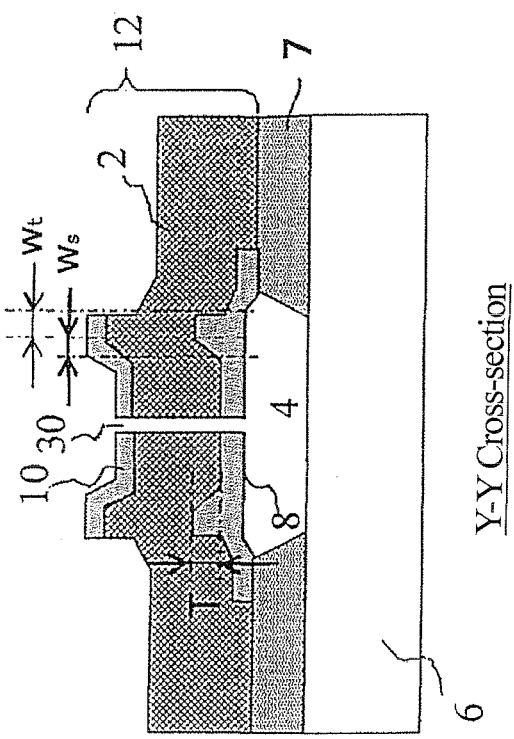
FIG. 7B A Y-Y cross-sectional view illustrating the exemplary embodiment of FIG. 7A.

FIG. 7A is an X-X cross-sectional view illustrating another exemplary embodiment of the thin-film piezoelectric resonator according to the present invention, and FIG. 7B is a Y-Y cross-sectional view illustrating the exemplary embodiment of FIG. 7A. The present exemplary embodiment differs from the exemplary embodiment illustrated in FIGS. 1A to 1C and the like only in the formation method of the first vibration region 41, second vibration region 42, and third vibration region 43. That is, in the present exemplary embodiment, the frame layer 16 is not formed but the thickness of the bottom electrode 8 is made to vary from area to area to thereby form the first vibration region 41, second vibration region 42, and third vibration region 43 in the vibration region 40. The thickness of the bottom electrode 8 in the first vibration region 41 is larger by T than that of the bottom electrode 8 in the third vibration region 43. In the second vibration region 42, the thickness of the bottom electrode 8 is reduced from the outer part contacting the first vibration region 41 toward the inner part contacting the third vibration region 43. As a result, the upper surface of the bottom electrode 8 is inclined with respect to the upper surface of the substrate 6 in the second vibration region 42, that is, formed into a slope.

The thin-film piezoelectric resonator of the exemplary embodiment illustrated in FIGS. 7A and 7B can be produced as follows. The procedure for forming the part from the insulating layer to sacrificial layer is the same as that described in the exemplary embodiment illustrated in FIGS. 1A to 1C and the like. The bottom electrode 8 is formed using a film formation technique such as sputtering, vapor deposition, or CVD method. Thereafter, a part of the bottom electrode 8 other than the first and second vibration regions 41 and 42 is etched to be removed by a predetermined amount using an etching technique such as RIE. At this time, the processing is performed using the above-mentioned RIE method such that the cross-section of the part corresponding to the second vibration region has a slope. Then, the above-mentioned etching technique is used to apply patterning so as to form the bottom electrode 8 into a predetermined outer shape. Further, the piezoelectric layer 2 and top electrode 10 are formed using the above-mentioned film formation method, followed by patterning of the piezoelectric layer 2 and top electrode 10 using the above-mentioned patterning technique. Thereafter, as in the case of the exemplary embodiment illustrated in FIGS. 1A to 1C and the like, the through hole 30 is formed so as to extend from the upper surface of the top electrode to the sacrificial layer, and the sacrificial layer and a part of the insulating layer are removed by means of etching solution so as to form the vibration space 4.

Figure 8A:
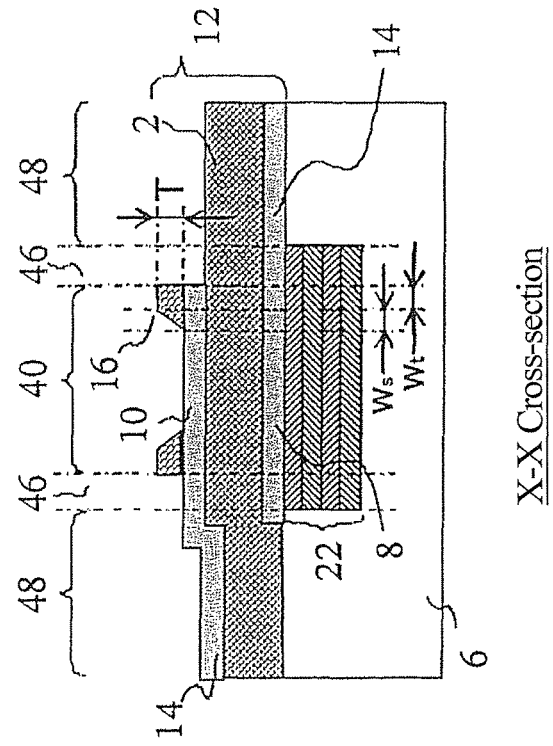
FIG. 8A An X-X cross-sectional view illustrating another exemplary embodiment of the thin-film piezoelectric resonator according to the present invention.
Figure 8B:
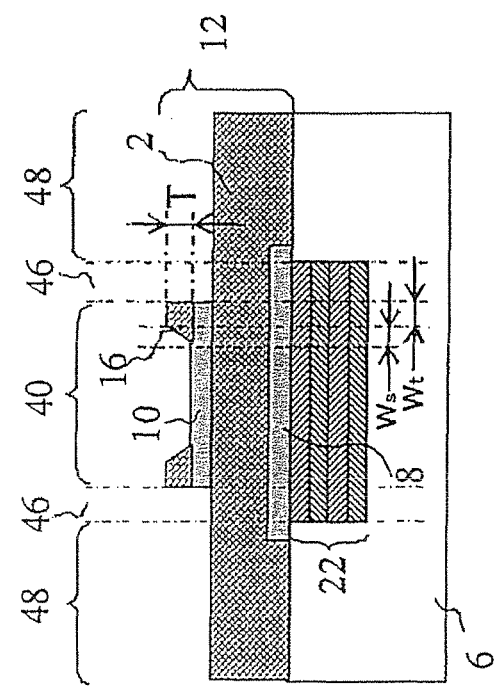
FIG. 8B A Y-Y cross-sectional view illustrating the exemplary embodiment of FIG. 8A.

FIG. 8A is an X-X cross-sectional view illustrating another exemplary embodiment of the thin-film piezoelectric resonator according to the present invention, and FIG. 8B is a Y-Y cross-sectional view illustrating the exemplary embodiment of FIG. 8A. The present exemplary embodiment differs from the exemplary embodiment illustrated in FIGS. 1A to 1C and the like only in that an acoustic reflection layer 22 is provided in place of the air gap 4.

The thin-film piezoelectric resonator of the exemplary embodiment illustrated in FIGS. 8A and 8B can be produced as follows. A pit portion is formed in the substrate 6 such as a silicon substrate using wet etching or the like, and then the acoustic reflection layer 22 is formed using the above-mentioned film formation technique. After that, the entire surface of the acoustic reflection layer 22 on the substrate is flattened using a flattening technique such as a CMP method so that the acoustic reflection layer 22 is deposited only in the pit portion. A low impedance layer included in the acoustic reflection layer 22 is preferably made of a material having a small acoustic impedance, such as $SiO_2$ or AN, and a high impedance layer included in the acoustic reflection layer 22 is preferably made of a material having a large acoustic impedance, such as Mo, W or $Ta_2O_5$. The acoustic reflection layer 22 is obtained by alternately stacking the low impedance layers and high impedance layers such that the thicknesses thereof respectively correspond to ¼ wavelength of the elastic wave. Then, the bottom electrode 8, piezoelectric layer 2 and top electrode 10 are formed using a film formation method such as sputtering or vapor deposition, and then patterning is applied to the respective layers using a patterning technique such as wet etching, RIE or lift-off. Further, the frame layer 16 is formed using the above-mentioned film formation technique, and patterning is applied to the obtained frame layer 16 using the above-mentioned patterning technique. At this time, the patterning is performed such that the frame layer 16 is formed in the outer peripheral portion of the vibration region 40, and that the end surface of the frame layer 16 on the center side of the vibration region 40 has a slope, to thereby form the second vibration region 42. As a method for forming the sloped shape, a patterning technique such as lift-off or RIE is preferable. The vibration region 40 exists inside the outer peripheral edge of the acoustic reflection layer 22 as viewed in the thickness direction of the piezoelectric resonator stack 12.

Figure 9A:
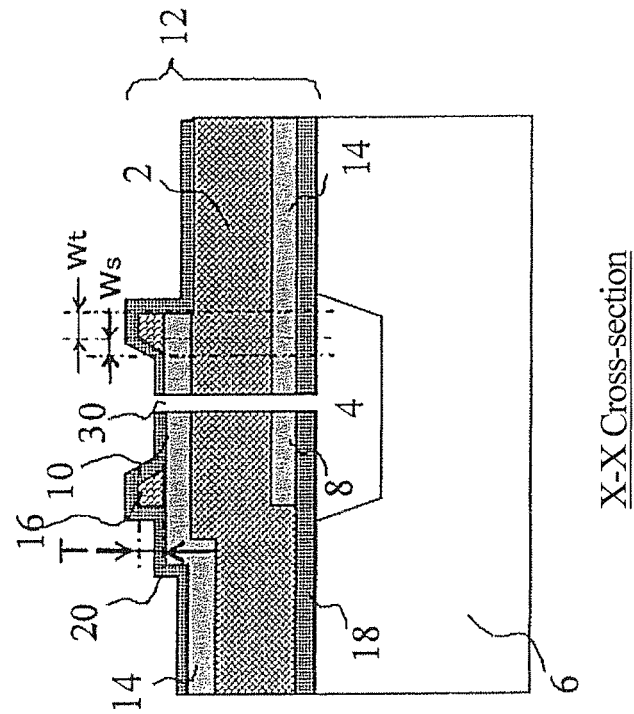
FIG. 9A An X-X cross-sectional view illustrating another exemplary embodiment of the thin-film piezoelectric resonator according to the present invention.
Figure 9B:
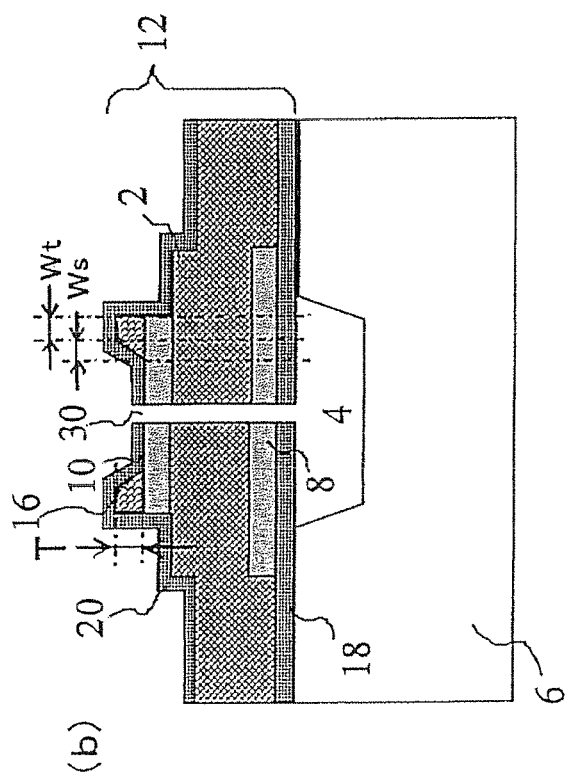
FIG. 9B A Y-Y cross-sectional view illustrating the exemplary embodiment of FIG. 9A.

FIG. 9A is an X-X cross-sectional view illustrating another exemplary embodiment of the thin-film piezoelectric resonator according to the present invention, and FIG. 9B is a Y-Y cross-sectional view illustrating the exemplary embodiment of FIG. 9A. The present exemplary embodiment differs from the exemplary embodiment illustrated in FIGS. 1A to 1C and the like only in that a lower dielectric layer 18 is formed under the bottom electrode 8 and an upper dielectric layer 20 is formed on the top electrode 10. The lower dielectric layer 18 and upper dielectric layer 20 are each preferably formed of a material having a comparatively high elasticity (high elastic modulus), such as aluminum nitride (AlN), aluminum oxynitride (AlON, e.g., AlOxNy (values of x and y satisfy, e.g., 0.9<x<1.4 and 0.1<y<0.5, respectively)), silicon nitride ($Si_3N_4$) or sialon (SiAlON) and are each preferably formed as a dielectric layer mainly containing at least one material selected from the group consisting of the above materials. Other configurations are the same as those of the exemplary embodiment illustrated in FIGS. 1A to 1C and the like, and the thin film piezoelectric resonator of the present embodiment can also be produced using the same method as the exemplary embodiment illustrated in FIGS. 1A to 1C and the like.

As in the case of the exemplary embodiments illustrated in FIGS. 1 (1A to 1C) to 8 (8A and 8B), even a thin-film piezoelectric resonator in which the lower dielectric layer 18 and/or upper dielectric layer 20 is/are formed as illustrated in FIGS. 9A and 9B can suppress occurrence of noise based on the spurious caused due to a different vibration mode or due to an unnecessary thickness longitudinal vibration and can obtain a high Q-value. Further, by forming the lower dielectric layer 18 and/or upper dielectric layer 20, it is possible to protect the bottom electrode 8 and/or top electrode 10.

Figure 10A:
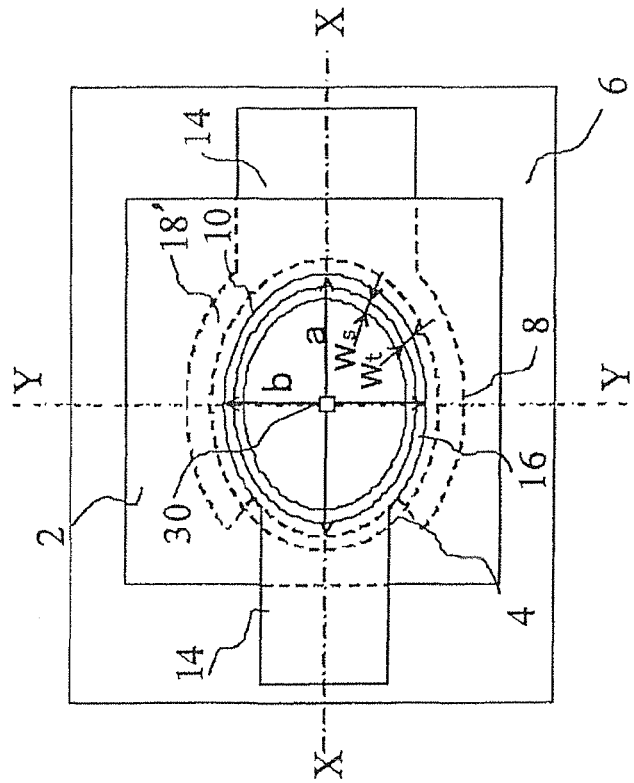
FIG. 10A A plan view schematically illustrating another exemplary embodiment of the thin-film piezoelectric resonator according to the present invention.
Figure 10B:
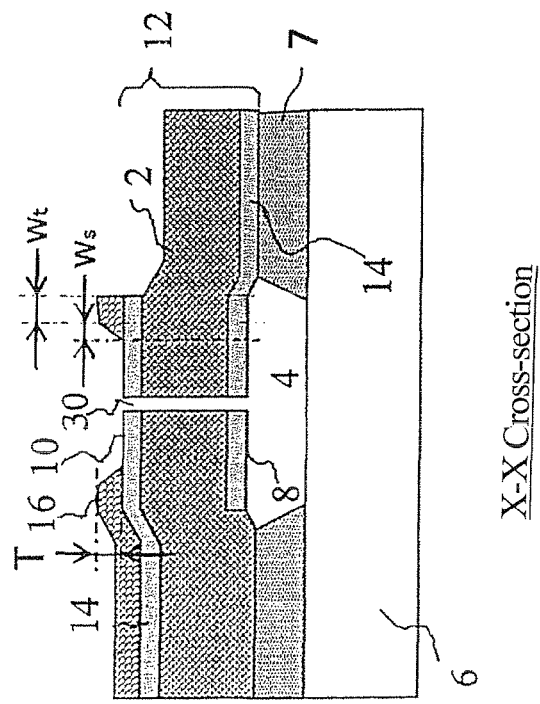
FIG. 10B An X-X cross-sectional view illustrating the exemplary embodiment of FIG. 10A.
Figure 10C:
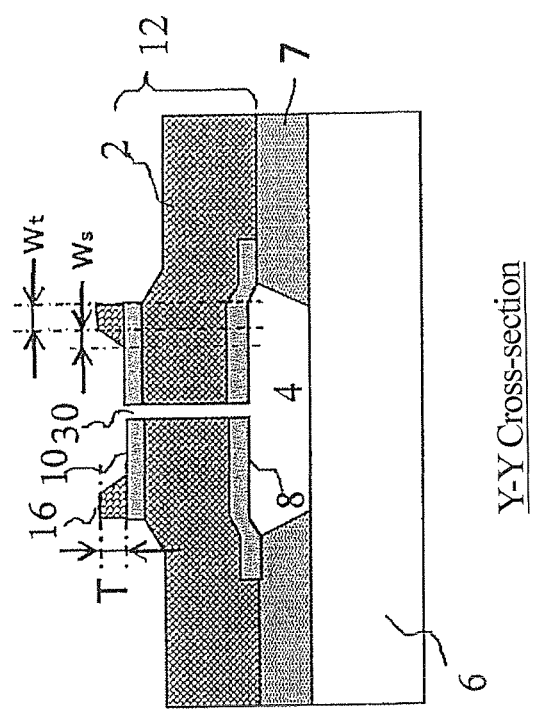
FIG. 10C A Y-Y cross-sectional view illustrating the exemplary embodiment of FIG. 10A.

FIG. 10A is a plan view schematically illustrating another exemplary embodiment of the thin-film piezoelectric resonator according to the present invention, FIG. 10B is a cross-sectional view taken along the line X-X of FIG. 10A, and FIG. 10C is a cross-sectional view taken along the line Y-Y of FIG. 10A. The present exemplary embodiment differs from the exemplary embodiment illustrated in FIGS. 1A to 1C and the like only in that the frame layer 16 exists in the buffer region 46 and support region 48 in addition to the first and second vibration regions 41 and 42. In this case, the frame layer 16 can be formed to have the same thickness in the first vibration region 41, buffer region 46, and support region 48. The frame layer 16 extends up to the upper surface of the connection conductor 14 connected to the top electrode 10. By extending the frame layer 16 to the buffer region 46 and support region 48, it is possible to reduce electrical resistance in the connection conductor 14, reduce the impedance (Rs) at the resonance frequency of the thin-film piezoelectric resonator, and increase the Q-value (Qs).

In the case where the top electrode 10 or bottom electrode 8 is used as a layer (vibration region zoning layer) for zoning the vibration region 40 into the first, second, and third vibration regions 41, 42, and 43, i.e., a layer having a sloped vertical cross-section in the second vibration region 42, the structure in which the vibration region zoning layer may be extended to the buffer region 46 and support region 48 can be adopted. Also in this case, the vibration region zoning layer can be formed to have the same thickness in the first vibration region 41, buffer region 46, and support region 48.

By using a plurality of the above-configured thin-film piezoelectric resonators according to the present invention, it is possible to construct a thin-film piezoelectric filter capable of suppressing occurrence of noise based on the spurious caused due to a different vibration mode or due to an unnecessary thickness longitudinal vibration. Examples of the thin-film piezoelectric filter include, but not limited thereto, a filter as illustrated in FIG. 11 in which thin-film piezoelectric resonators are arranged in a ladder pattern and a filter as illustrated in FIG. 12 in which thin-film piezoelectric resonators are arranged in a lattice pattern.

Figure 11:
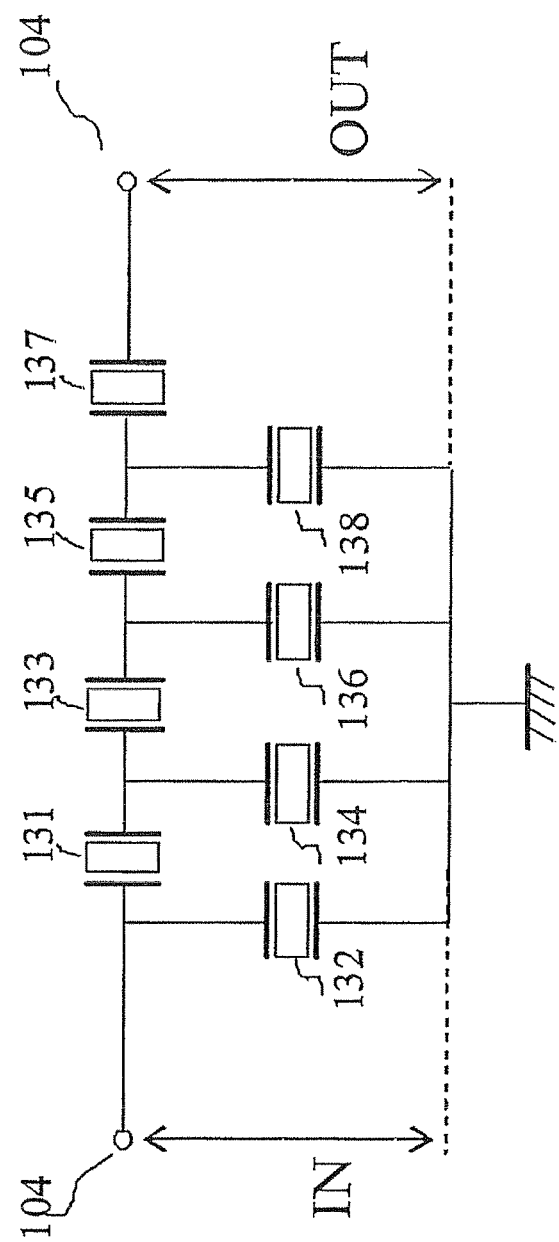
FIG. 11 A circuit diagram of a ladder-type filter which is an exemplary embodiment of a filter using the thin-film piezoelectric resonator according to the present invention.
Figure 12:
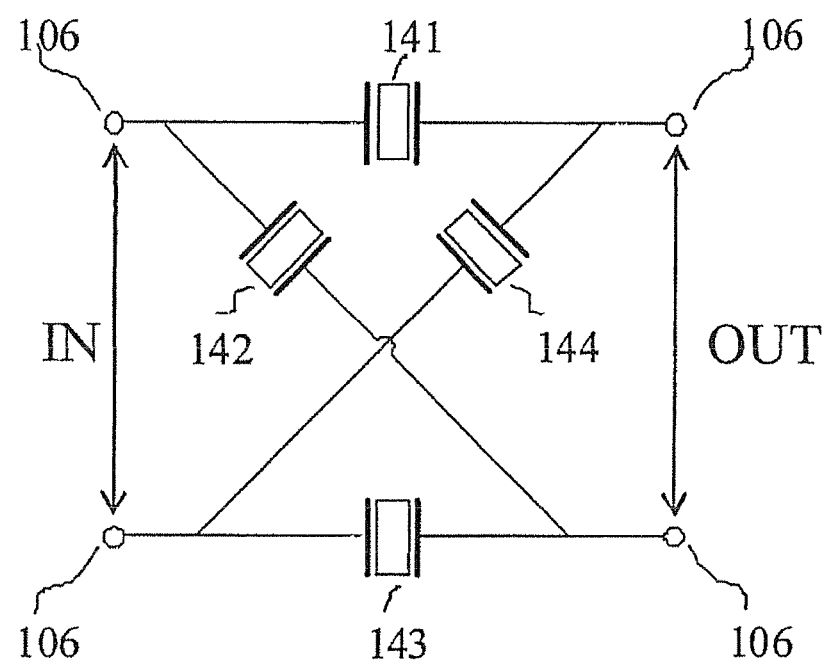
FIG. 12 A circuit diagram of a lattice-type filter which is an exemplary embodiment of a filter using the thin-film piezoelectric resonator according to the present invention.

The ladder-type filter illustrated in FIG. 11 includes series thin-film piezoelectric resonators (131, 133, 135, 137) connected in series to an input/output port 104 and parallel thin-film piezoelectric resonators (132, 134, 136, 138) connected between the nodes connecting the series thin-film piezoelectric resonators and the ground. The resonance frequency and antiresonance frequency of the series thin-film piezoelectric resonators are set to fs1 and fp1, respectively, and the resonance frequency and antiresonance frequency of the parallel thin-film piezoelectric resonators are set to fs2 and fp2, respectively. In this case, the fs1 and fp2 are set close to the center frequency of the band-pass filter. Therefore, the resonator performance (Rs, Qs) of the series thin-film piezoelectric resonator near the resonance frequency and resonator performance (Rp, Qp) of the parallel thin-film piezoelectric resonator near the antiresonance frequency significantly influence the performance in the passband of the band-pass filter.

As described above, the thin-film piezoelectric resonator according to the present invention has characteristics in that the Rp at the antiresonance frequency can be increased to increase the Qp. On the other hand, although the thin-film piezoelectric resonator according to the present invention can suppress occurrence of noise in a frequency band lower than the resonance frequency, the noise in the frequency band lower than the resonance frequency is greater than that of a thin-film piezoelectric resonator of a Comparative Example 5 to be described later in which the vibration region is uniformly formed. Thus, the thin-film piezoelectric resonator according to the present invention is used only as a parallel thin-film piezoelectric resonator for the ladder-type filer illustrated in FIG. 11 or lattice-type filter illustrated in FIG. 12 so as to make full use of the characteristics of high Rp which is one of the main advantages of the thin-film piezoelectric resonator according to the present invention. This further allows the influence of noise in a frequency band lower than the resonance frequency to be eliminated to thereby suppress occurrence of noise in the passband, whereby a thin-film piezoelectric filter with reduced insertion loss can be obtained.

Figure 20A:
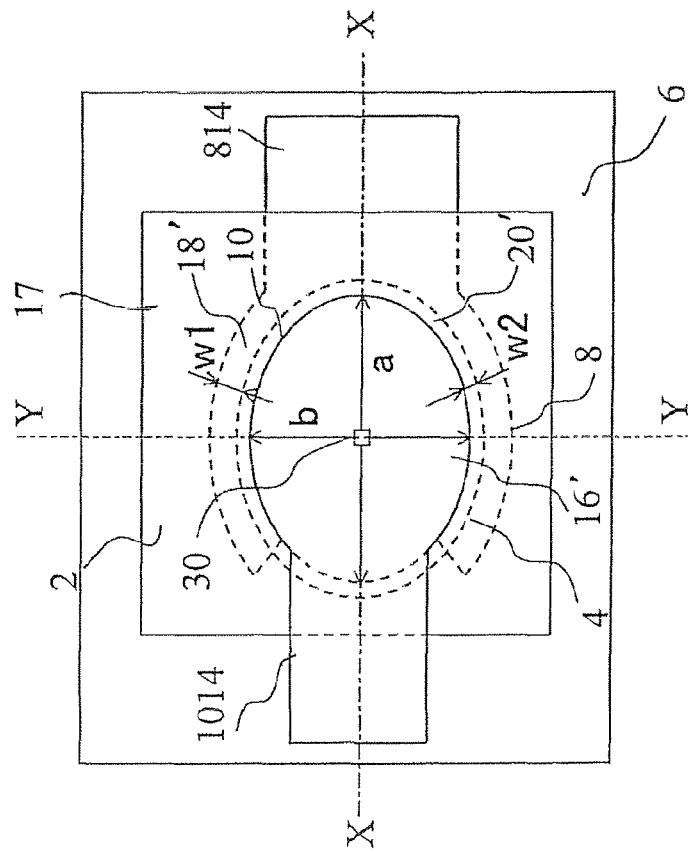
FIG. 20A A plan view schematically illustrating an exemplary embodiment of a thin-film piezoelectric resonator according to the present invention.
Figure 20B:
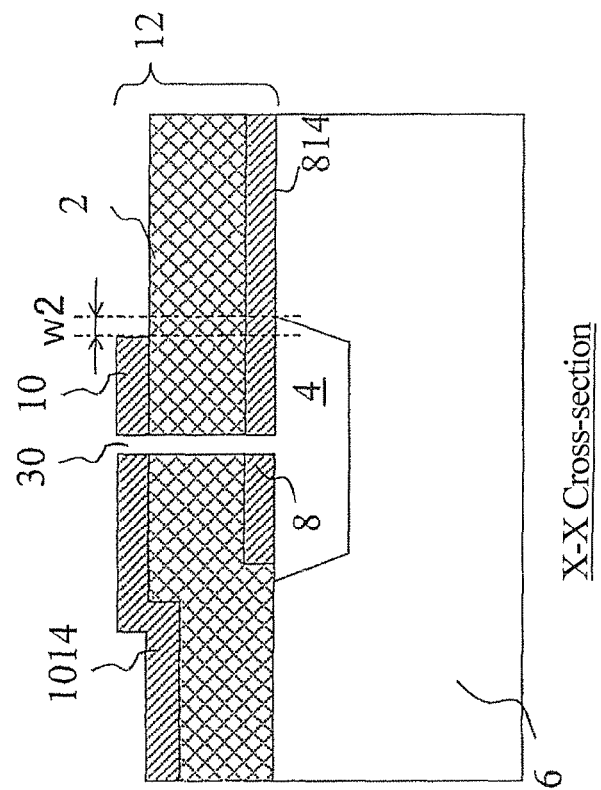
FIG. 20B A cross-sectional view taken along the line X-X of FIG. 20A.
Figure 20C:
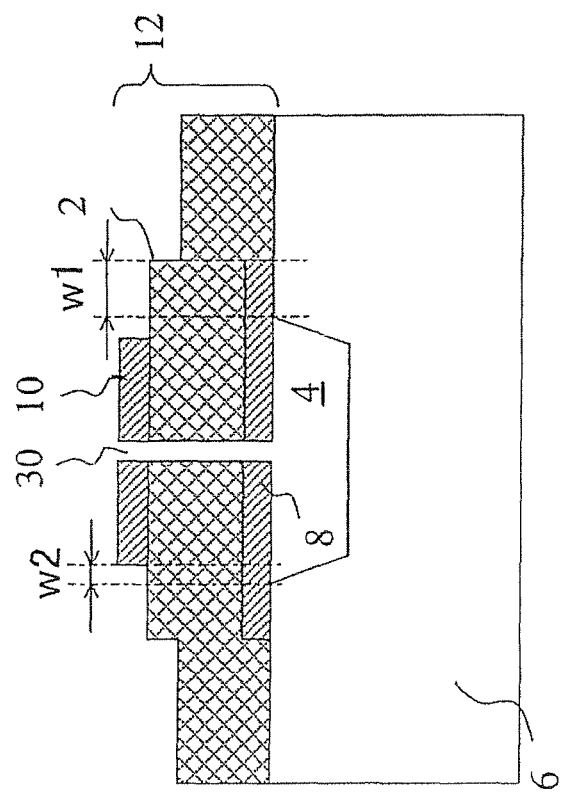
FIG. 20C A cross-sectional view taken along the line Y-Y of FIG. 20A.

FIG. 20A is a plan view schematically illustrating another exemplary embodiment of the thin-film piezoelectric resonator according to the present invention, FIG. 20B is a cross-sectional view taken along the line X-X of FIG. 20A, and FIG. 20C is a cross-sectional view taken along the line Y-Y of FIG. 20A. The thin film piezoelectric resonator according to the present exemplary embodiment includes a piezoelectric resonator stack 12, a cavity 4 formed under the piezoelectric resonator stack 12, and a substrate 6 serving as a support member that supports the piezoelectric resonator stack 12 in such a manner as to form the cavity 4.

The piezoelectric resonator stack 12 is a laminated body including: a piezoelectric layer 2, a bottom electrode 8 and its external connection conductor 814; and an top electrode 10 and its external connection conductor 1014. The bottom and top electrodes are formed so as to sandwich the piezoelectric layer 2 in its thickness direction, i.e., in the thickness direction of the piezoelectric resonator stack 12 (direction perpendicular to the paper surface in FIG. 20A, i.e., direction perpendicular to both X-X direction and Y-Y direction: the same applies in the following description). The bottom electrode 8 and its external connection conductor 814 are located at the lower side of the piezoelectric layer 2 and connected to each other. The top electrode 10 and its external connection conductor 1014 are located at the upper side of the piezoelectric layer 2 and connected to each other. The external connection conductors 814 and 1014 are conductive thin films for connecting the top and bottom electrodes 10 and 8 to a not-illustrated external circuit and can be formed using the same materials as those of the top and bottom electrodes 10 and 8 as the same layers, respectively. The boundary between the bottom electrode 8 and external connection conductor 814 or between the top electrode 10 and external conductive connector 1014 corresponds to a line obtained by extending the outer shape line of a part of the top or bottom electrode that does not contact the external connection conductor. The external connection conductors 814 and 1014 correspond to the external connection conductor 14 in the exemplary embodiments illustrated in FIGS. 1A to 1C and the like.

The piezoelectric resonator stack 12 is not limited to the region where all of the piezoelectric layer 2, bottom electrode 8, external connection conductor 814, top electrode 10, and external connection conductor 1014 are formed, but covers also a region where the electrode or external connection conductor is not formed. The piezoelectric resonator stack 12 includes a vibration region 16' where the top and bottom electrodes 10 and 8 overlap each other as viewed in the thickness direction of the piezoelectric resonator stack 12, a support region 17 contacting the substrate 6, and a buffer region 20' between the vibration region 16' and support region 17. The vibration region 16' exists inside the outer peripheral edge of the cavity 4 as viewed in the thickness direction of the piezoelectric resonator stack 12. The bottom electrode 8 has a support portion 18' having a width of w1 and extending along the boundary between the support region 17 and buffer region 20' in the support region 17. As illustrated, the support portion 18' can be formed so as not to overlap the top electrode 10 and external connection conductor 1014 connected to the top electrode 10 as viewed in the thickness direction of piezoelectric resonator stack 12.

Figure 21:
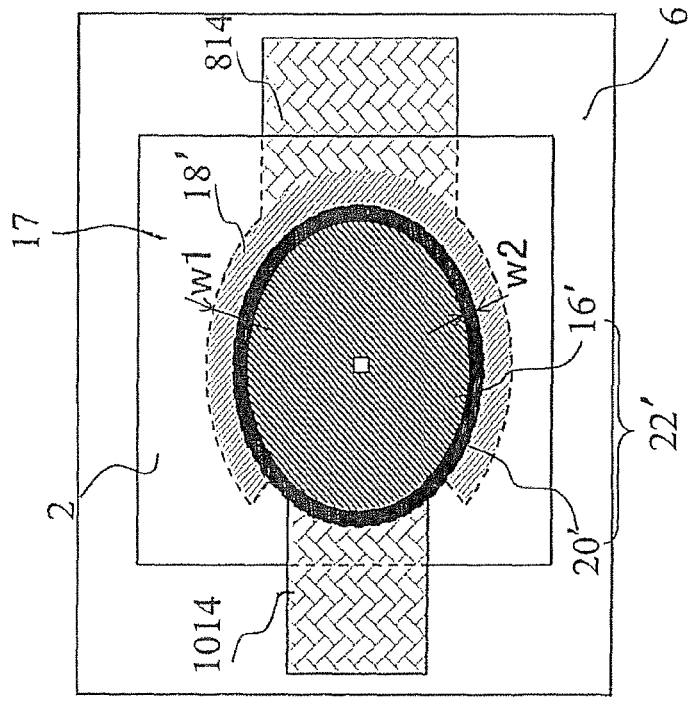
FIG. 21 A plan view schematically illustrating a vibration region, buffer region, support region, and bottom electrode support portion according to the exemplary embodiment of the thin-film piezoelectric resonator according to the present invention.

FIG. 21 is a view for clarifying the positional relationship among the vibration region 16', buffer region 20', support region 17, and bottom electrode support portion 18' in the exemplary embodiment illustrated in FIGS. 20A to 20C. In FIG. 21, the region corresponding to the cavity 4 as viewed in the thickness direction of the piezoelectric resonator stack 12 is indicated as a cavity region 22'. The cavity region 22' corresponds to a region obtained by combining the vibration region 16' and buffer region 20'.

In the present exemplary embodiment, the piezoelectric resonator stack 12 has the characteristic configuration as described with regard to the exemplary embodiments illustrated in FIGS. 1 (1A to 1C) to 10 (10A to 10C) and, although not illustrated, the vibration region 16' includes the first to third vibration regions 41 to 43 as in the case of the vibration region 40. Thus, as described with regard to FIGS. 1 (1A to 1C) to 10 (10A to 10C), by configuring the piezoelectric resonator stack 12 such that the resonance frequency of the primary thickness longitudinal vibration in the second vibration region 42 gradually increases from the outer part contacting the first vibration region 41 toward the inner part contacting the third vibration region 43, a thin-film piezoelectric resonator capable of suppressing occurrence of noise based on the spurious caused due to different vibration mode or due to unnecessary thickness longitudinal vibration and excellent in the Q-value can be obtained.

In the exemplary embodiment illustrated in FIGS. 20A to 20C, assuming that the thickness (thickness in the center portion of the vibration region 16', i.e., thickness in the third vibration region) of the piezoelectric resonator stack 12 is t and the width of the buffer region 20' is w2, the width w1 of the bottom electrode support portion 18' and thickness t of the piezoelectric resonator stack 12 in the vibration region 16' satisfy a relationship of $2.17 \leq w1/t \leq 10$, and the width w2 of the buffer region 20' and thickness t of the piezoelectric resonator stack 12 in the vibration region 16' satisfy a relationship of $0.25 \leq w2/t \leq 2$. As a result, a thin-film piezoelectric resonator having a large effective $kt^2$ and a high Q-value (corresponding to the Qp described above) and having an extremely robust structure with less breakage can be achieved.

Further, in the present exemplary embodiment, the vibration region 16' has an ellipse shape and, assuming that the major axis dimension of the ellipse is a and minor axis dimension thereof is b, the major axis dimension a and minor axis dimension b satisfy a relationship of $1 < a/b \leq 1.9$. As a result, a thin-film piezoelectric resonator capable of suppressing occurrence of an unnecessary vibration mode and suppressing ripple generated in the passband of the thin-film piezoelectric filter, as well as, having a large effective $kt^2$, a high Q-value and having an extremely robust structure can be achieved. In the case where a relationship of $a/b > 1.9$ is satisfied, the effective $kt^2$ is reduced in some degree, and the major axis becomes very long with respect to the minor axis, causing deflection of the piezoelectric resonator stack 12, which makes breakage more likely to occur during a manufacturing process.

As materials of the thin-film piezoelectric resonator according to the present invention, the same materials as used for conventional thin-film piezoelectric resonators may be used. For example, the substrate 6 is formed of a silicon substrate, a gallium arsenide substrate, or a glass substrate. The cavity 4 can be formed by anisotropic wet etching or RIE (Reactive Ion Etching). The piezoelectric layer 2 is formed of a piezoelectric material capable of being produced as a thin film, such as zinc oxide (ZnO) or aluminum nitride (AlN). The bottom electrode 8, external connection conductor 814, top electrode 10, and external connection conductor 1014 are each formed of a metal material capable of being produced as a thin film to which patterning can be applied, such as aluminum (Al), tungsten (W), molybdenum (Mo) platinum (Pt), ruthenium (Ru), iridium (Ir) or gold (Au), or a laminated body made from those metal materials as thin films.

The thin-film piezoelectric resonator according to the present exemplary embodiment can be produced as follows. A pit portion is formed on the substrate 6 such as a silicon wafer by a technique such as wet etching, and a sacrificial layer is then formed by a film formation technique as CVD. After that, the entire surface of the sacrificial layer and entire surface of the substrate are flattened using a flattening technique such as a CMP method so that the sacrificial layer is deposited only in the pit portion. The sacrificial layer is preferably made from such materials as PSG (Phospho-silicate glass) which can be easily etched. Then, the piezoelectric resonator stack 12 including the bottom electrode 8, external connection conductor 814, piezoelectric layer 2, top electrode 10, and external connection conductor 1014 is formed using a film formation technique such as sputtering or vapor deposition and a patterning technique such as wet etching, RIE or lift-off. This patterning is performed so as to satisfy the relationship between the width w1 of the bottom electrode support portion 18' and thickness t of the piezoelectric resonator stack 12 in the vibration region 16' and relationship between the width w2 of the buffer region 20' and thickness t of the piezoelectric resonator stack 12 in the vibration region 16', as well as, the relationship between the major axis dimension a and minor axis dimension b of the ellipse in the vibration region 16'. Subsequently, the through hole 30 is formed so as to extend from the upper surface of the piezoelectric resonator stack 12 to the sacrificial layer using the above-mentioned patterning technique, and the sacrificial layer is removed by means of etching solution supplied through the through hole 30. As a result, the cavity 4 is formed in the pit portion.

Figure 22A:
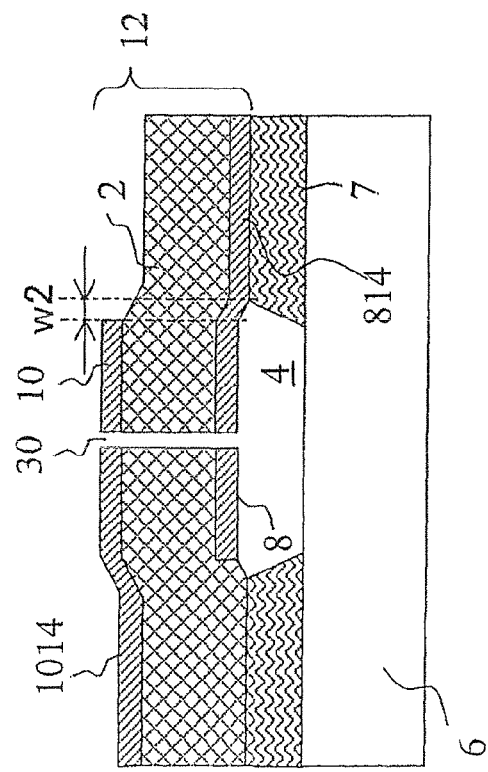
FIG. 22A A cross-sectional view schematically illustrating an exemplary embodiment of a thin-film piezoelectric resonator according to the present invention.
Figure 22B:
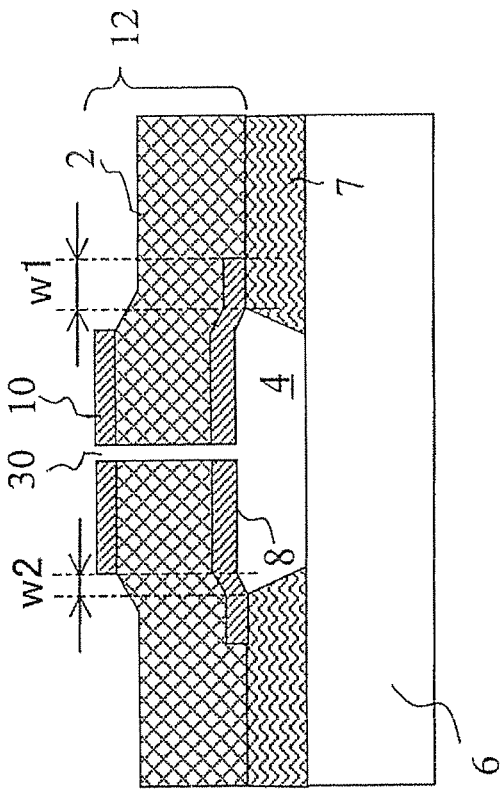
FIG. 22B A cross-sectional view schematically illustrating an exemplary embodiment of a thin-film piezoelectric resonator according to the present invention.

FIGS. 22A and 22B are cross-sectional views schematically illustrating another embodiment of the thin-film piezoelectric resonator according to the present invention. FIG. 22A is a cross-sectional view corresponding to FIG. 20B, and FIG. 22B corresponds to FIG. 20C. The plan view of the present exemplary embodiment is the same as FIG. 20A.

In the exemplary embodiment of FIGS. 20A to 20C, the substrate 6 is used as the support member, and the cavity 4 is formed in the substrate 6. On the other hand, in the exemplary embodiment of FIGS. 22A and 22B, the substrate 6 has an insulating layer 7 formed as an upper layer thereof. The cavity 4 is formed by removing a part of the insulating layer 7. Other configurations are the same as those of the exemplary embodiment illustrated in FIGS. 20A to 20C.

The thin-film piezoelectric resonator according to the exemplary embodiment of FIGS. 22A and 22B can be produced as follows. A silicon oxide ($SiO_2$) layer is formed, as an insulating layer, on the substrate 6 such as a silicon wafer by a film formation technique such as sputtering or CVD, or thermal oxidation. After that, a sacrificial layer which can be easily dissolved in etching solution is formed by a film formation technique such as sputtering or vapor deposition, and patterning is applied, using a patterning technique such as wet etching, RIE, or lift-off, such that the sacrificial layer remains at a portion where the cavity 4 is to be formed. The sacrificial layer may be a metal such as germanium (Ge), aluminum (Al), titanium (Ti), magnesium (Mg) or oxide thereof. Thereafter, the piezoelectric resonator stack 12 including the bottom electrode 8, external connection conductor 814, piezoelectric layer 2, top electrode 10, and external connection conductor 1014 is formed using a film formation technique such as sputtering or vapor deposition and a patterning technique such as wet etching, RIE or lift-off. This patterning is performed so as to satisfy the relationship between the width w1 of the bottom electrode support portion 18' and thickness t of the piezoelectric resonator stack 12 in the vibration region 16' and relationship between the width w2 of the buffer region 20' and thickness t of the piezoelectric resonator stack 12 in the vibration region 16', as well as, the relationship between the major axis dimension a and minor axis dimension b of the ellipse in the vibration region 16'. Subsequently, the through hole 30 is formed so as to extend from the upper surface of the piezoelectric resonator stack 12 to the sacrificial layer using the above-mentioned patterning technique, and the sacrificial layer is removed by means of etching solution supplied through the through hole 30. Further, etching solution capable of etching the $SiO_2$ layer is selected, followed by etching of the $SiO_2$ layer by means of the etching solution supplied through the through hole 30, whereby the $SiO_2$ layer is etched with the same pattern as that of the sacrificial layer. As a result, the cavity 4 is formed in the portion obtained by removing the sacrificial layer and insulating layer.

Figure 23A:
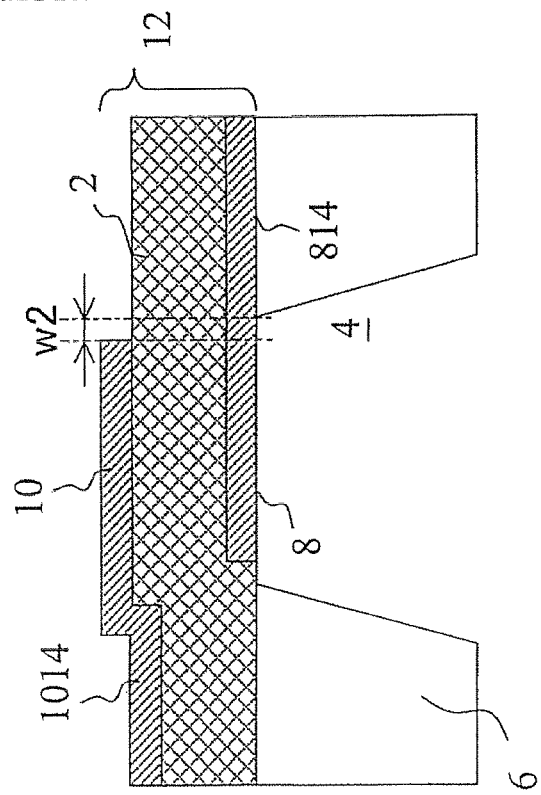
FIG. 23A A cross-sectional view schematically illustrating an exemplary embodiment of a thin-film piezoelectric resonator according to the present invention.
Figure 23B:
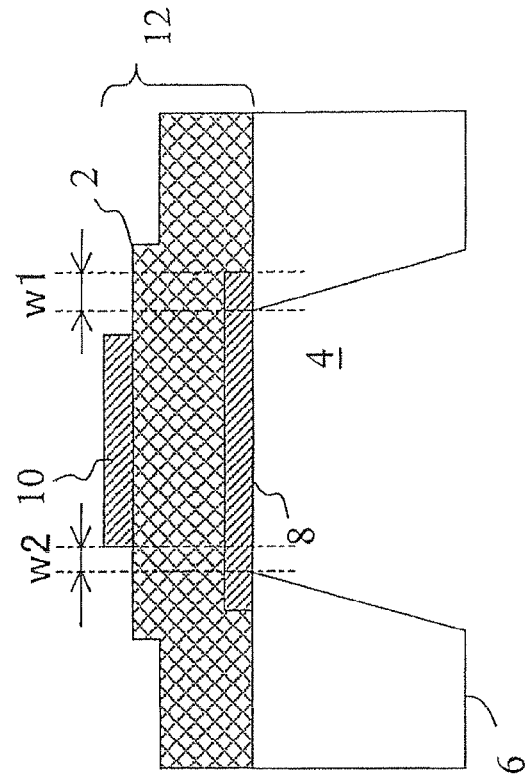
FIG. 23B A cross-sectional view schematically illustrating an exemplary embodiment of a thin-film piezoelectric resonator according to the present invention.

FIGS. 23A and 23B are cross-sectional views schematically illustrating another embodiment of the thin-film piezoelectric resonator according to the present invention. FIG. 23A is a cross-sectional view corresponding to FIG. 20B, and FIG. 23B corresponds to FIG. 20C. The plan view of the present exemplary embodiment is the same as FIG. 20A.

The exemplary embodiment of FIGS. 23A and 23B is the same as the exemplary embodiment of FIGS. 20A to 20C in that the cavity 4 is formed in the substrate 6 but differs in that the cavity 4 is formed so as to penetrate the substrate 6 from the rear surface thereof. The cavity 4 having such a configuration also corresponds to the cavity formed between the substrate 6 and piezoelectric resonator stack 12. Other configurations are the same as those of the exemplary embodiment illustrated in FIGS. 20A to 20C.

The thin-film piezoelectric resonator according to the exemplary embodiment of FIGS. 23A and 23B can be produced as follows. The piezoelectric resonator stack 12 including the bottom electrode 8, external connection conductor 814, piezoelectric layer 2, top electrode 10, and external connection conductor 1014 is formed on the substrate 6 using a film formation technique such as sputtering or vapor deposition and a patterning technique such as wet etching, RIE or lift-off. This patterning is performed so as to satisfy the relationship between the width w1 of the bottom electrode support portion 18' and thickness t of the piezoelectric resonator stack 12 in the vibration region 16' and relationship between the width w2 of the buffer region 20' and thickness t of the piezoelectric resonator stack 12 in the vibration region 16', as well as, the relationship between the major axis dimension a and minor axis dimension b of the ellipse in the vibration region 16'. Thereafter, etching is effected from the rear surface of the substrate 6 up to the lower part of the piezoelectric resonator stack 12 using anisotropic wet etching or deep-etching technique such as Deep-RIE to thereby form the cavity 4.

Figure 24A:
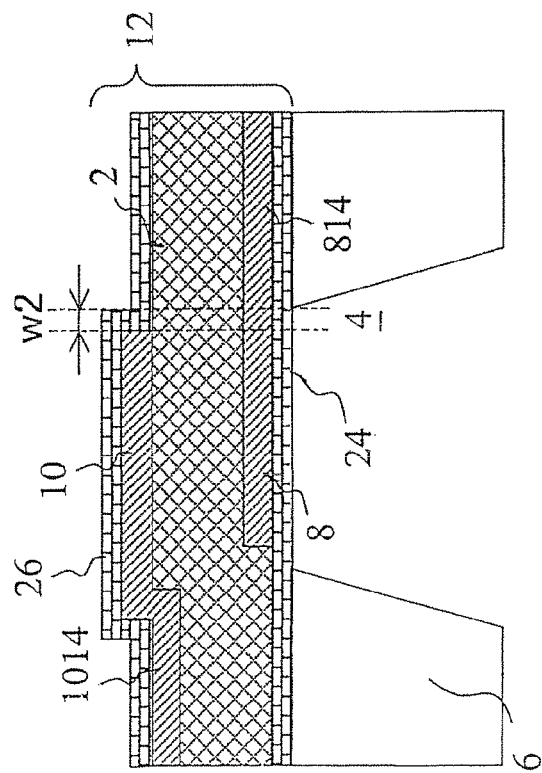
FIG. 24A A cross-sectional view schematically illustrating an exemplary embodiment of a thin-film piezoelectric resonator according to the present invention.
Figure 24B:
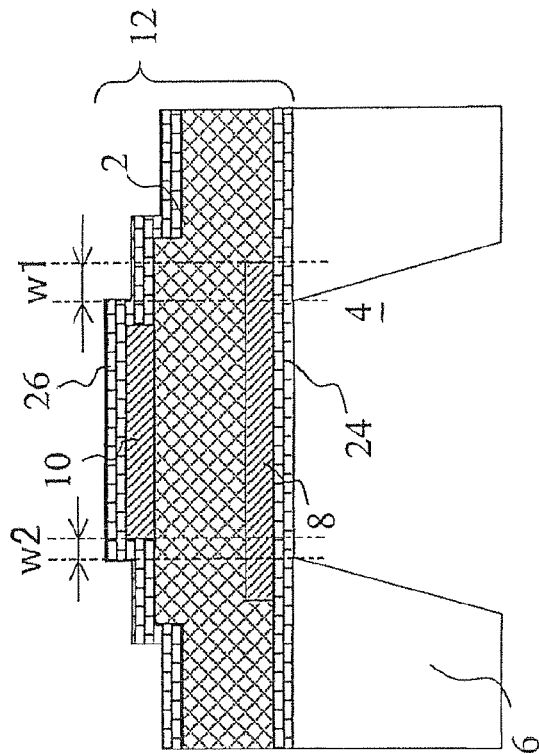
FIG. 24B A cross-sectional view schematically illustrating an exemplary embodiment of a thin-film piezoelectric resonator according to the present invention.

FIGS. 24A and 24B are cross-sectional views schematically illustrating another embodiment of the thin-film piezoelectric resonator according to the present invention. FIG. 24A is a cross-sectional view corresponding to FIG. 20B, and FIG. 24B corresponds to FIG. 20C.

In the thin-film piezoelectric resonator according to the present exemplary embodiment, the piezoelectric resonator stack 12 has a lower dielectric layer 24 under the bottom electrode 8 and an upper dielectric layer 26 on the top electrode 10. The lower dielectric layer 24 and upper dielectric layer 26 are each preferably formed of a material having a comparatively high elasticity, such as AlN, AlON, $Si_3N_4$ or SiAlON. Other configurations are the same as those of the exemplary embodiment illustrated in FIGS. 23A and 23B. The plan view of the present exemplary embodiment is the same as FIG. 20A except for the dielectric layers 24 and 26.

By forming the lower dielectric layer 24 and/or upper dielectric layer 26, it is possible to prevent oxidation degradation of the bottom electrode 8 and external connection conductor 814 and/or top electrode 10 and external connection conductor 1014. Further, the formation of the lower dielectric layer 24 increases the bearing capacity of the piezoelectric resonator stack 12, thereby achieving a thin-film piezoelectric resonator with a more robust structure.

As in the exemplary embodiments of FIGS. 20 (20A to 20C) to 23 (23A and 23B), according to the present exemplary embodiment, it is possible to achieve an extremely robust thin-film piezoelectric resonator having a large effective $kt^2$ and a high Q-value without involving characteristic degradation due to a lateral acoustic mode.

EXAMPLES

Table 1 illustrates conditions for carrying out Examples 1 to 28 and Comparative Examples 1 to 5, and Table 2 illustrates electrical characteristics of thin-film piezoelectric resonator obtained by these Examples and Comparative Examples.

Example 1

The thin-film piezoelectric resonator as described in the exemplary embodiment of FIGS. 1A to 1C was produced. The shape of the top electrode 10, i.e., the shape of the vibration region 40 was an ellipse with the major axis dimension a of 107 μm and the minor axis dimension b of 72 μm, and the shape of the through hole 30 was a 5 μm×5 μm square. According to the present example, the material and thickness of each constitutional layer were set as follows: the bottom electrode 8 was made of Mo with a thickness of 300 nm; the piezoelectric layer 2 was made of AlN with a thickness of 1200 nm; and the top electrode 10 was made of Ru with a thickness of 300 nm. Further, the frame layer 16 was made of Mo with a thickness (T) of 100 nm, the first vibration region 41 was formed with a thickness (Wt) of 3 μm, and the second vibration region 42 was formed with a slope angle θ of 20°. In this case, the width (Ws) was 0.27 μm (Ws=T/tan θ).

The thin-film piezoelectric resonator of Example 1 was produced as follows. The $SiO_2$ layer 7 which was an insulating layer was formed on the silicon substrate 6 by thermal oxidation. Thereafter, a titanium (Ti) layer as sacrificial layer was formed by sputtering, and was then patterned by RIE. Then, an Mo layer serving as the bottom electrode 8, an AlN layer serving as the piezoelectric layer 2, and an Ru layer serving as the top electrode 10 were formed by sputtering, and patterning was applied to the respective layers by RIE. Further, an Mo layer serving as the frame layer 16 was formed, and patterning was applied to the frame layer 16 according to the inner peripheral shape of the frame layer 16 by RIE such that the end surface of the inner peripheral portion had a sloped shape. Concretely, a resist was formed such that the end portion of the resist had a sloped shape and, thereafter, RIE was used for etching with etching gas obtained by mixing $Cl_2$ gas with $O_2$ gas. By setting the angle of the slope of the resist end portion to about 45° and gas flow rate of the etching gas ($O_2$ gas) to 30 sccm, the slope angle θ of the inner peripheral end surface of the frame layer 16 was set to 20°. Thereafter, according to the outer peripheral shape of the frame layer 16, the top electrode 10 and frame layer 16 were etched by RIE using $Cl_2$ gas as the etching gas. Further, the through hole 30 was formed so as to extend from the upper surface of the top electrode 10 to the sacrificial layer using RIE, and the sacrificial layer and a part of the insulating layer 7 were etched and removed by means of hydrofluoric acid as etching solution. As a result, the vibration space 4 was formed in the portion obtained by removing the sacrificial layer and insulating layer 7. By forming the bottom electrode 8 to be larger in size than the sacrificial layer by a predetermined dimension and the top electrode 10 to be smaller than the sacrificial layer by a predetermined dimension, the buffer region 46 was formed on the air gap 4, and the support region 48 was formed on the insulating layer 7 of the substrate 6.

Figure 13A:
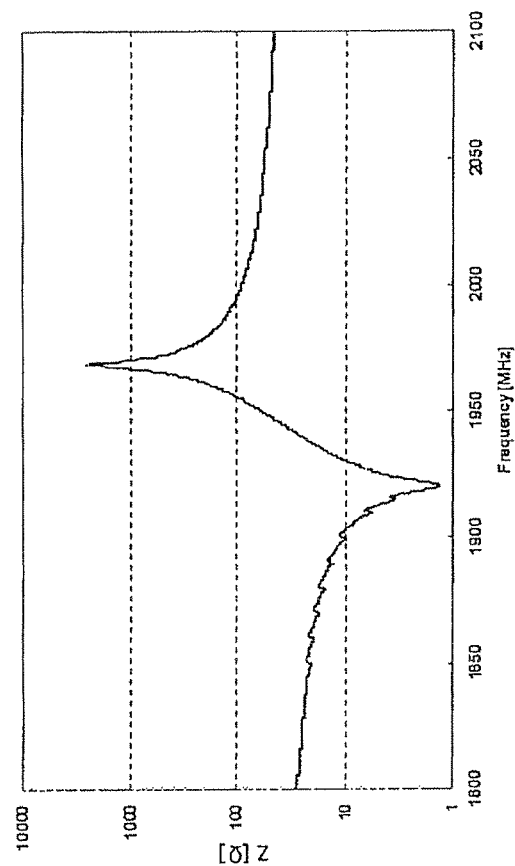
FIG. 13A A diagram showing a frequency characteristics of the impedance of the thin-film piezoelectric resonator produced in Example 1.
Figure 13B:
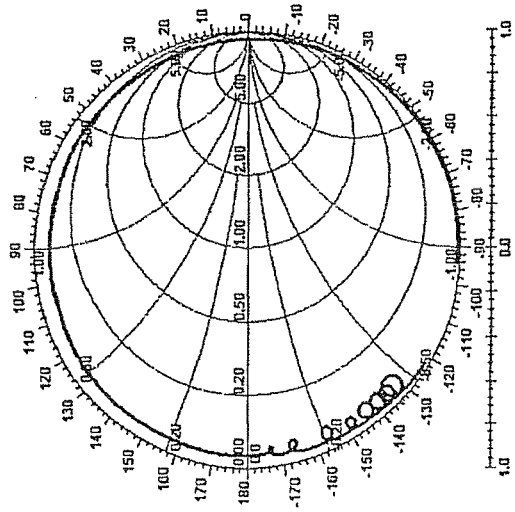
FIG. 13B A diagram of Smith chart of the thin-film piezoelectric resonator produced in Example 1.

The frequency characteristics of the impedance and Smith chart of the resonator thus produced are illustrated in FIGS. 13A and 13B, respectively. It can be seen from FIGS. 13A and 13B, occurrence of noise is suppressed in and around the frequency band from the resonance frequency to antiresonance frequency. The noise level illustrated in FIGS. 13A and 13B was evaluated as "low" in the following Examples and Comparative Examples. Further, the impedance (Rp) at the antiresonance frequency of the obtained thin-film piezoelectric resonator was as high as 2600Ω, and the Q-value (Qp) was as high as 1430.

Examples 2 to 5

The thin-film piezoelectric resonators as described in the exemplary embodiment of FIGS. 1A to 1C were produced in the same manner as Example 1 except that the slope angle θ of the cross-section of the frame layer 16 in the second vibration region 42 was set to 30°, 45°, 60°, or 70°, as illustrated in Table 1. Adjustment of the slope angle θ of the inner peripheral end surface of the frame layer 16 was conducted by adjusting the gas flow rate of the $O_2$ etching gas. In this case, the width (Ws) of the second vibration region 42 was in the range of 0.04 μm to 0.17 μm.

As illustrated in Table 2, the impedances (Rp) of the obtained thin-film piezoelectric resonators at the antiresonance frequency were as high as 2380Ω to 2740Ω, and Q-values (Qp) were as high as 1420 to 1500. Further, as denoted by the noise level in Table 2, the noise levels in and around the frequency band from the resonance frequency to antiresonance frequency were "low" or "intermediate". Thus, occurrence of noise was suppressed. The noise level "intermediate" means a level between the "low" level illustrated in FIGS. 13A and 13B and "high" level illustrated in FIGS. 14A and 14B to be described later.

Comparative Example 1

The thin-film piezoelectric resonator as described in the exemplary embodiment of FIGS. 1A to 1C was produced in the same manner as Example 1 except that the slope angle θ of the cross-section of the frame layer 16 in the second vibration region 42 was set to 90°. In this case, the width (Ws) of the second vibration region 42 was 0 μm.

Figure 14A:
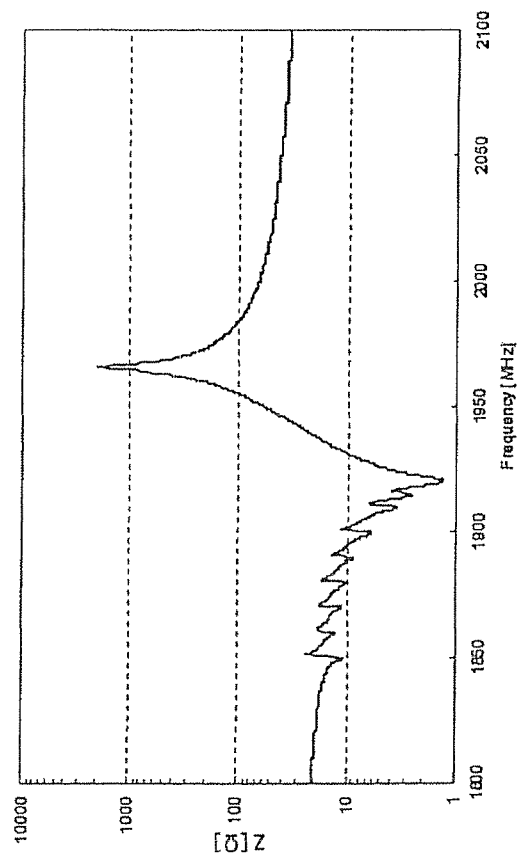
FIG. 14A A diagram showing a frequency characteristics of the impedance of the thin-film piezoelectric resonator produced in Comparative Example 1.
Figure 14B:
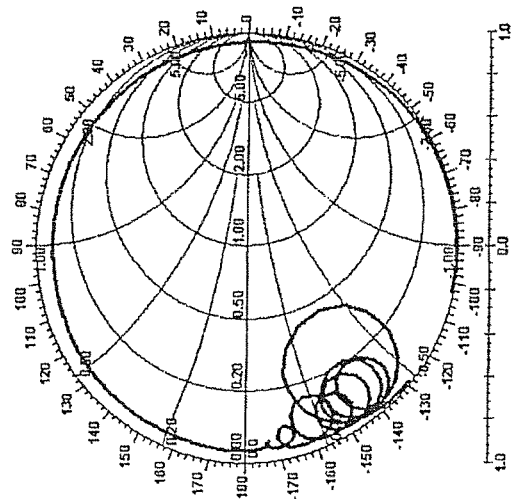
FIG. 14B A diagram of Smith chart of the thin-film piezoelectric resonator produced in Comparative Example 1.

The frequency characteristics of the impedance and Smith chart of the resonator thus produced are illustrated in FIGS. 14A and 14B, respectively. It can be seen from FIGS. 14A and 14B, the level of the generated noise was increased in and around the frequency band from the resonance frequency to antiresonance frequency. The noise level illustrated in FIGS. 14A and 14B was evaluated as "high" in the following Examples and Comparative Examples. Further, the impedance (Rp) at the antiresonance frequency of the obtained thin-film piezoelectric resonator was 2060Ω, which was lower than those of Examples 1 to 5. Further, the Q-value (Qp) was 1260, which was lower than those of Examples 1 to 5.

Examples 6 to 11

The thin-film piezoelectric resonators as described in the exemplary embodiment of FIGS. 1A to 1C were produced in the same manner as Example 1 except that the width (Wt) of the first vibration region 41 was set to 1.5 μm, 4.0 μm, or 6.0 μm, and slope angle θ of the cross-section of the frame layer 16 in the second vibration region 42 was set to 45° or 60°, as illustrated in Table 1. In this case, the width (Ws) of the second vibration region 42 was 0.10 μm or 0.06 μm.

As illustrated in Table 2, the impedances (Rp) of the obtained thin-film piezoelectric resonators at the antiresonance frequency were as high as 2220Ω to 2480Ω, and Q-values (Qp) were as high as 1330 to 1430. Further, as denoted by the noise level in Table 2, the noise levels in and around the frequency band from the resonance frequency to antiresonance frequency were "low" or "intermediate". Thus, occurrence of noise was suppressed.

Comparative Examples 2 to 4

The thin-film piezoelectric resonators as described in the exemplary embodiment of FIGS. 1A to 1C were produced in the same manner as Example 1 except that the width (Wt) of the first vibration region 41 was set to 1.5 μm, 4.0 μm, or 6.0 μm, and slope angle θ of the cross-section of the frame layer 16 in the second vibration region 42 was set to 90°. In this case, the width (Ws) of the second vibration region 42 was 0 μm.

As illustrated in Table 2, the impedances (Rp) of the obtained thin-film piezoelectric resonators at the antiresonance frequency were in the range of 1880Ω to 2080Ω, which were lower than those of Examples 6 to 11. Further, the Q-values (Qp) were in the range of 1200 to 1270, which were lower than those of Examples 6 to 11. Further, the noise levels in and around the frequency band from the resonance frequency to antiresonance frequency were "high". Thus, the level of each generated noise was increased.

Example 12

The thin-film piezoelectric resonator as described in the exemplary embodiment of FIGS. 10A to 10C having the frame layer 16 extended up to the upper surface of the external connection conductor 14 connected to the top electrode 10 in the buffer region 46 and support region 48 was produced. The frame layer 16 has the same, i.e., uniform thickness in the first vibration region 41, buffer region 46, and support region 48. The thin-film piezoelectric resonator of the present Example was produced in the same manner as Example 3 except for having the extended frame layer 16.

As illustrated in Table 2, the impedance (Rp) of the obtained thin-film piezoelectric resonator at the antiresonance frequency was as high as 2740Ω, and Q-value (Qp) was as high as 1500. Further, as denoted by the noise level in Table 2, the level of the noise in and around the frequency band from the resonance frequency to antiresonance frequency was "low". Thus, occurrence of noise was suppressed. Further, as compared with other Examples, the impedance (Rs) at the resonance frequency was as low as 1.1Ω, and Q-value (Qs) was as high as 1580.

Thus, it has been clear that by extending the frame layer 16 up to the top electrode external connection conductor 14 in the buffer region 46 and support region 48, a more satisfactory thin-film piezoelectric resonator can be obtained.

Examples 13 to 15

The thin-film piezoelectric resonators as described in the exemplary embodiment of FIGS. 6A and 6B were produced with the constituent layer (vibration region zoning layer) for zoning the vibration region 40 into the first, second, and third vibration regions 41, 42, and 43 set as the Ru top electrode layer 10, the increased thickness T of the top electrode layer 10 in the first vibration region 41 set to 120 nm, and slope angle θ of the cross-section in the second vibration region 42 set to 45°, 60°, or 70°. In this case, the width (Ws) of the second vibration region 42 was in the range of 0.04 μm to 0.12 μm. The thickness and material of each constituent layer were same as those of Example 1.

The thin-film piezoelectric resonators of Examples 13 to 15 were produced as follows. The $SiO_2$ layer 7 which was an insulating layer was formed on the silicon substrate 6 by thermal oxidation. Thereafter, a titanium (Ti) layer as sacrificial layer was formed by sputtering, and was then patterned by RIE. Then, an Mo layer serving as the bottom electrode 8 and an AlN layer serving as the piezoelectric layer were formed by sputtering, and patterning was applied to the respective layers by RIE. Further, an Ru layer serving as the top electrode 10 was formed, and patterning was applied to the Ru layer according to the shape of the second vibration region 42 by RIE such that the end surface of the inner peripheral portion had a sloped shape. Concretely, a resist was formed such that the end portion of the resist had a sloped shape and, thereafter, RIE was used for etching with etching gas obtained by mixing $CF_4$ gas with $O_2$ gas. Subsequently, the top electrode 10 was etched according to the shape of the outer peripheral shape of the top electrode 10 by RIE using the $CF_4$ gas as the etching gas. Further, the through hole 30 was formed so as to extend from the upper surface of the top electrode 10 to the sacrificial layer using RIE, and the sacrificial layer and a part of the insulating layer 7 were etched and removed by means of hydrofluoric acid as etching solution. As a result, the vibration space 4 was formed in the portion obtained by removing the sacrificial layer and insulating layer 7. By forming the bottom electrode 8 to be larger in size than the sacrificial layer by a predetermined dimension and the top electrode 10 to be smaller than the sacrificial layer by a predetermined dimension, the buffer layer 46 was formed on the air gap 4, and the support region 48 was formed on the insulating layer 7 of the substrate 6.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were as high as 2330Ω to 2640Ω, and Q-values (Qp) were as high as 1400 to 1450. Further, as denoted by the noise level in Table 2, the noise levels in and around the frequency band from the resonance frequency to antiresonance frequency were "low" or "intermediate". Thus, occurrence of noise was suppressed.

Examples 17 to 19

The thin-film piezoelectric resonators as described in the exemplary embodiment of FIGS. 7A and 7B were produced with the constituent layer (vibration region zoning layer) for zoning the vibration region 40 into the first, second, and third vibration regions 41, 42, and 43 set as the Mo bottom electrode layer 8, the increased thickness T of the bottom electrode layer 8 in the first vibration region 41 set to 120 nm, and slope angle θ of the cross-section in the second vibration region 42 set to 45°, 60°, or 70°. In this case, the width (Ws) of the second vibration region 42 was in the range of 0.04 μm to 0.12 μm. The thicknesses and materials of the respective constituent layers were the same as those in Example 1.

The thin-film piezoelectric resonators of Examples 17 to 19 were produced as follows. The $SiO_2$ layer 7 which was an insulating layer was formed on the silicon substrate 6 by thermal oxidation. Thereafter, a titanium (Ti) layer as sacrificial layer was formed by sputtering, and was then patterned by RIE. Then, an Mo layer serving as the bottom electrode 8 was formed by sputtering, and patterning was applied to the Mo layer according to the shape of the second vibration region 42 by RIE such that the end surface of the inner peripheral portion had a sloped shape. Concretely, a resist was formed such that the end portion of the resist had a sloped shape and, thereafter, RIE was used for etching with etching gas obtained by mixing $Cl_2$ gas with $O_2$ gas. Subsequently, the bottom electrode 8 was etched according to the shape of the outer peripheral shape of the bottom electrode 8 by RIE using the $Cl_2$ gas as the etching gas. Thereafter, an AlN layer serving as the piezoelectric layer 2 and an Ru layer serving as the top electrode 10 were formed, and patterning was applied to the respective layers by RIE. Further, the through hole 30 was formed so as to extend from the upper surface of the top electrode 10 to the sacrificial layer using RIE, and the sacrificial layer and a part of the insulating layer 7 were etched and removed by means of hydrofluoric acid as etching solution. As a result, the vibration space 4 was formed in the portion obtained by removing the sacrificial layer and insulating layer 7. By forming the bottom electrode 8 to be larger in size than the sacrificial layer by a predetermined dimension and the top electrode 10 to be smaller than the sacrificial layer by a predetermined dimension, the buffer layer 46 was formed on the air gap 4, and the support region 48 was formed on the insulating layer 7 of the substrate 6.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were as high as 2330Ω to 2600Ω, and Q-values (Qp) were as high as 1400 to 1450. Further, as denoted by the noise level in Table 2, the noise levels in and around the frequency band from the resonance frequency to antiresonance frequency were "low" or "intermediate". Thus, occurrence of noise was suppressed.

Examples 16 and 20

The thin-film piezoelectric resonators were produced in the same manner as Examples 13 and 17 except that the increased thickness portion of the top electrode 10 or bottom electrode 8 as the constituent layer (vibration region zoning layer) for zoning the vibration region 40 into the first, second, and third vibration regions 41, 42, and 43 was extended up to the external connection conductor 14 connected to the top electrode 10 or bottom electrode 8 in the buffer region 46 and support region 48. The top electrode 10 or bottom electrode 8 serving as the vibration range zoning layer has the same, i.e., uniform thickness in the first vibration region 41, buffer region 46, and support region 48.

As illustrated in Table 2, the impedances (Rp) of the obtained thin-film piezoelectric resonators at the antiresonance frequency were as high as 2620Ω and 2630Ω, and Q-values (Qp) were as high as 1450 and 1420. Further, as denoted by the noise level in Table 2, the noise levels in and around the frequency band from the resonance frequency to antiresonance frequency were "low". Thus, occurrence of noise was suppressed. Further, as compared with Examples 13 to 15 or Examples 17 to 19, the impedances (Rs) at the resonance frequency were as low as 1.2Ω and 1.1Ω, and Q-values (Qs) were as high as 1530 and 1590.

Examples 21 and 22

The thin-film piezoelectric resonators were produced in the same manner as Examples 3 and 4 except that aluminum (Al) was used as the material of the frame layer 16 and the thickness T of the frame layer 16 was set to 200 nm. In this case, the widths (Ws) of the second vibration region 42 were 0.20 μm and 0.12 μm.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were 2200Ω and 2180Ω, and Q-values (Qp) were 1330 and 1320. As compared with Examples 3 and 4, the resonance characteristics at the antiresonance frequency were slightly deteriorated. Further, as denoted by the noise level in Table 2, the noise levels in and around the frequency band from the resonance frequency to antiresonance frequency were "low" or "intermediate". Thus, occurrence of noise was suppressed.

Examples 23 and 24

The thin-film piezoelectric resonators were produced in the same manner as Examples 3 and 4 except that gold (Au) was used as the material of the frame layer 16. In this case, the widths (Ws) of the second vibration region 42 were 0.10 μm and 0.06 μm.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were 2220Ω and 2190Ω, and Q-values (Qp) were 1330 and 1320. As compared with Examples 3 and 4, the resonance characteristics at the antiresonance frequency were slightly deteriorated. Further, as denoted by the noise level in Table 2, the noise levels in and around the frequency band from the resonance frequency to antiresonance frequency were "low" or "intermediate". Thus, occurrence of noise was suppressed.

Examples 25 and 26

The thin-film piezoelectric resonators were produced in the same manner as Examples 3 and 4 except that tungsten (W) was used as the material of the frame layer 16. In this case, the widths (Ws) of the second vibration region 42 were 0.10 μm and 0.06 μm.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were as high as 2680Ω and 2620Ω, and Q-values (Qp) were as high as 1480 and 1450. Further, as denoted by the noise level in Table 2, the noise levels in and around the frequency band from the resonance frequency to antiresonance frequency were "low" or "intermediate". Thus, occurrence of noise was suppressed. The values of $kt^2$ were slightly reduced, as compared to Examples 3 and 4, to 6.0% and 6.1%.

Examples 27 and 28

The thin-film piezoelectric resonators were produced in the same manner as Examples 3 and 4 except that iridium (Ir) was used as the material of the frame layer 16 and the thickness T of the frame layer 16 was set to 80 nm. In this case, the widths (Ws) of the second vibration region 42 were 0.08 μm and 0.05 μm.

Table 2 illustrates the impedances (Rp) and Q-values (Qp) at the antiresonance frequency, and noise levels in the obtained thin-film piezoelectric resonators. The impedances (Rp) of the obtained thin-film piezoelectric resonators at the antiresonance frequency were as high as 2420Ω and 2400Ω, and Q-values (Qp) were as high as 1430 and 1400. Further, as denoted by the noise level in Table 2, the noise levels in and around the frequency band from the resonance frequency to antiresonance frequency were "low" or "intermediate". Thus, occurrence of noise was suppressed. The values of $kt^2$ were reduced, as compared to Examples 3 and 4, to 5.8%.

Comparative Example 5

The thin-film piezoelectric resonator was produced in the same manner as Example 1 except that the frame layer 16 was not formed.

Figure 15A:
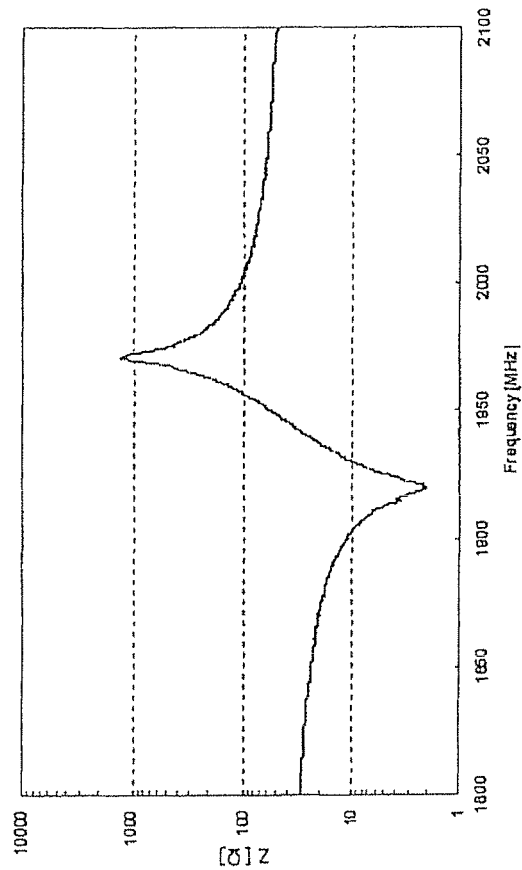
FIG. 15A A diagram showing a frequency characteristics of the impedance of the thin-film piezoelectric resonator produced in Comparative Example 5.
Figure 15B:
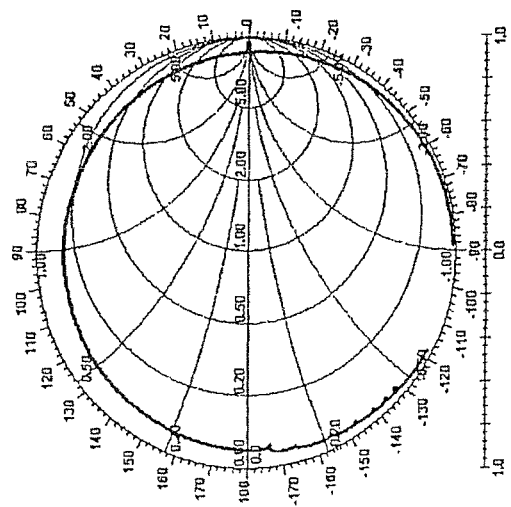
FIG. 15B A diagram of Smith chart of the thin-film piezoelectric resonator produced in Comparative Example 5.

The frequency characteristics of the impedance and Smith chart of the impedance of the resonator thus produced are illustrated in FIGS. 15A and 15B, respectively. Table 2 illustrates the electrical characteristics of the obtained thin-film piezoelectric resonator. The occurrence of noise in a frequency band lower than the resonance frequency was significantly suppressed; however, Rp at the antiresonance frequency was as low as 1320Ω, and Q-value (Qp) was as low as 820.

Example 29

The ladder-type thin-film piezoelectric filter illustrated in FIG. 11 was produced using the thin-film piezoelectric resonators as described in the exemplary embodiment of FIGS. 1A to 1C having the same conditions concerning the frame 16 as those set in Example 12. In the present Example, the frame layer 16 of the thin-film piezoelectric resonator described in Example 12 as applied to both the series thin-film piezoelectric resonators and parallel thin-film piezoelectric resonators.

Figure 16:
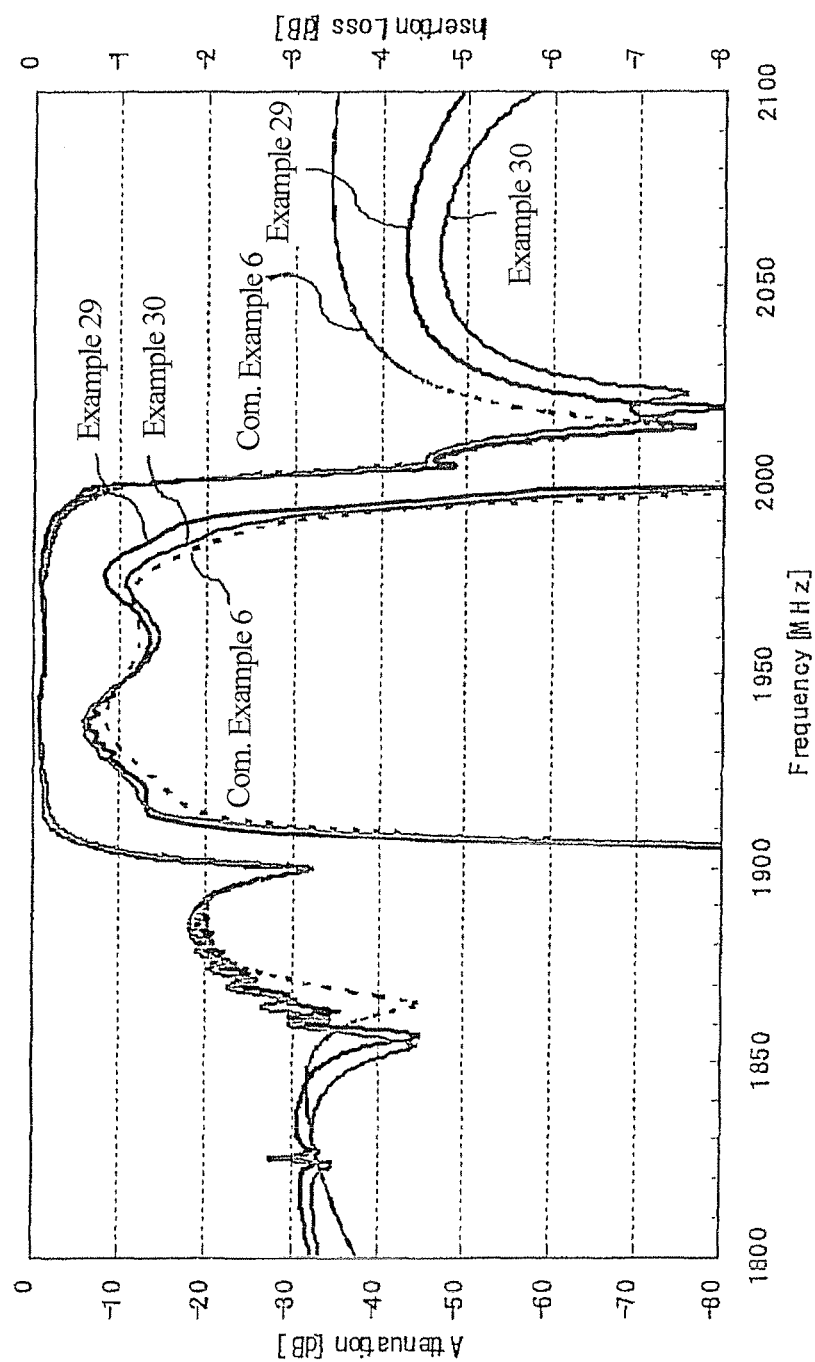
FIG. 16 A diagram showing band-pass characteristics of the thin-film piezoelectric filter produced in Examples 29 and 30 and Comparative Example 6.

The band-pass characteristics of the thin-film piezoelectric filter are illustrated in FIG. 16. As compared with the band-pass characteristics of a thin-film piezoelectric filter of Comparative Example 6 to be described later which was produced using only the thin-film piezoelectric resonators in each of which the frame layer 16 was not formed, the insertion loss in the passband (1920 MHz to 1980 MHz) was reduced. However, noise occurred on the low frequency side (1920 MHz to 1940 MHz) of the passband and in the attenuation band of 1800 MHz to 1900 MHz.

Example 30

The ladder-type thin-film piezoelectric filter illustrated in FIG. 11 was produced using the thin-film piezoelectric resonators as described in the exemplary embodiment of FIGS. 1A to 1C having the same conditions concerning the frame 16 as those set in Example 12. In the present Example, the frame layer 16 of the thin-film piezoelectric resonator described in Example 12 was applied only to the parallel thin-film piezoelectric resonators.

The band-pass characteristics of the thin-film piezoelectric filter is illustrated in FIG. 16. As compared with the band-pass characteristics of a thin-film piezoelectric filter of Comparative Example 6 to be described later which was produced using only the thin-film piezoelectric resonators in each of which the frame layer 16 was not formed, the insertion loss in the passband (1920 MHz to 1980 MHz) was reduced. Further, as compared with Example 29, occurrence of noise on the low frequency side of the passband was suppressed and thus extremely satisfactory band-pass characteristics was achieved.

Comparative Example 6

Figure 17A:
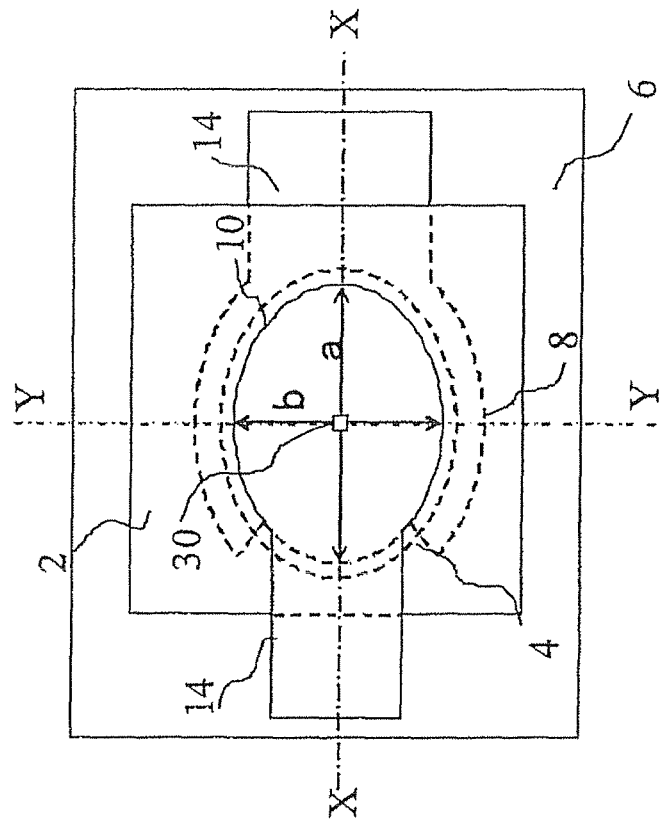
FIG. 17A A plan view schematically illustrating an example of the conventional thin-film piezoelectric resonator.
Figure 17B:
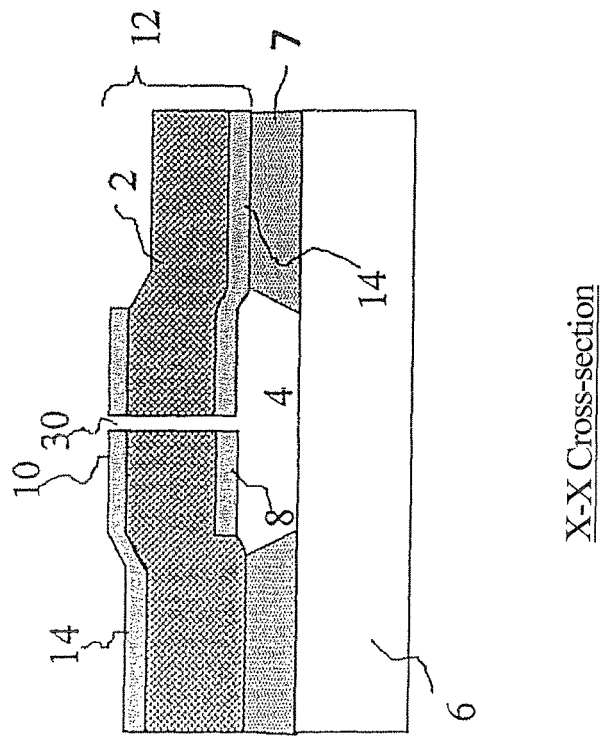
FIG. 17B A cross-sectional view taken along the line X-X of FIG. 17A.
Figure 17C:
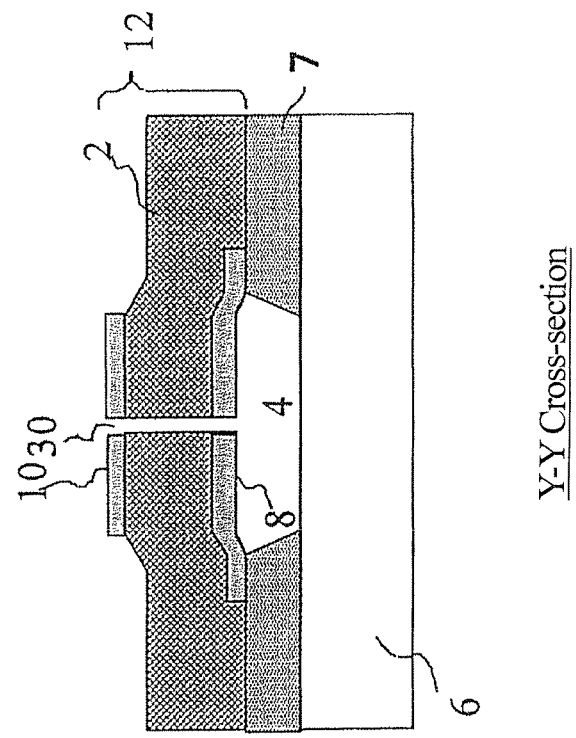
FIG. 17C A cross-sectional view taken along the line Y-Y of FIG. 17A.
Figure 18A:
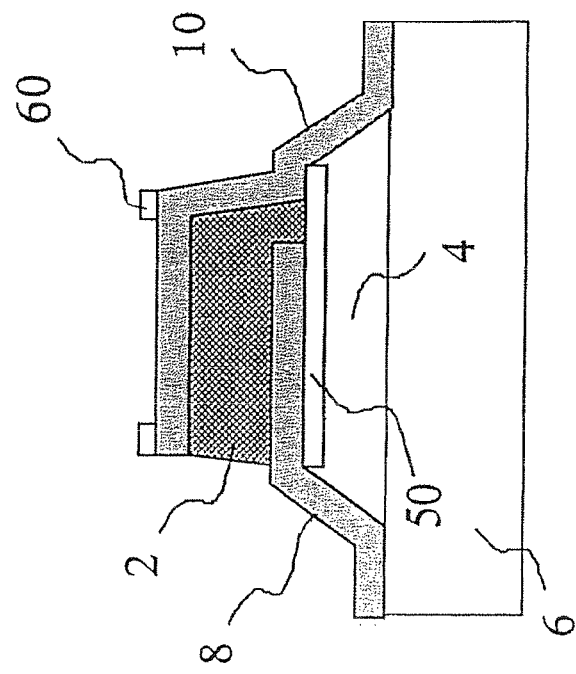
FIG. 18A A cross-sectional view schematically illustrating the conventional thin-film piezoelectric resonator of type 1 having a frame-like zone.
Figure 18B:
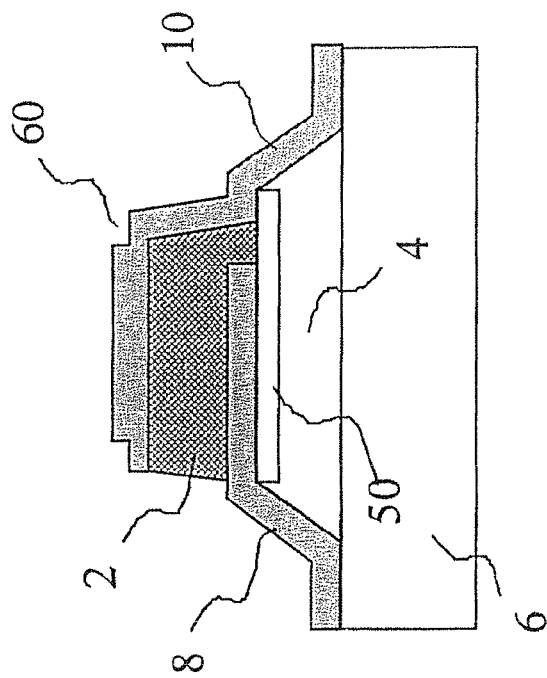
FIG. 18B A cross-sectional view schematically illustrating the conventional thin-film piezoelectric resonator of type 2 having a frame-like zone.
Figure 19A:
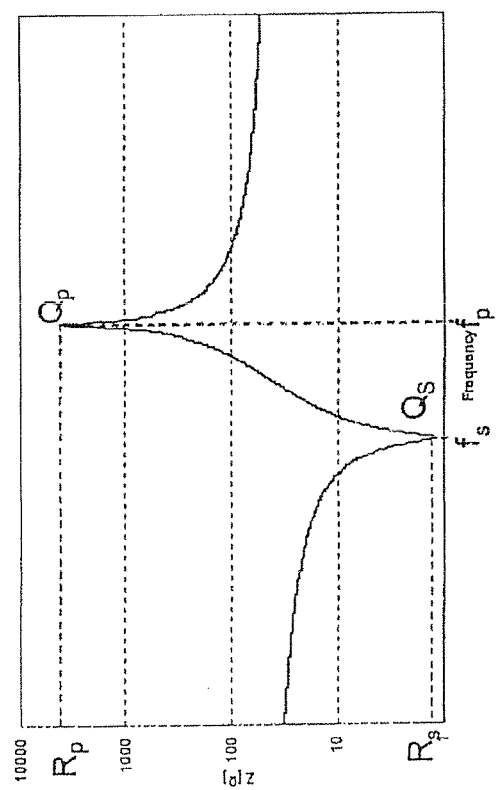
FIG. 19A A diagram showing a frequency characteristics of the impedance of general thin-film piezoelectric resonator.
Figure 19B:
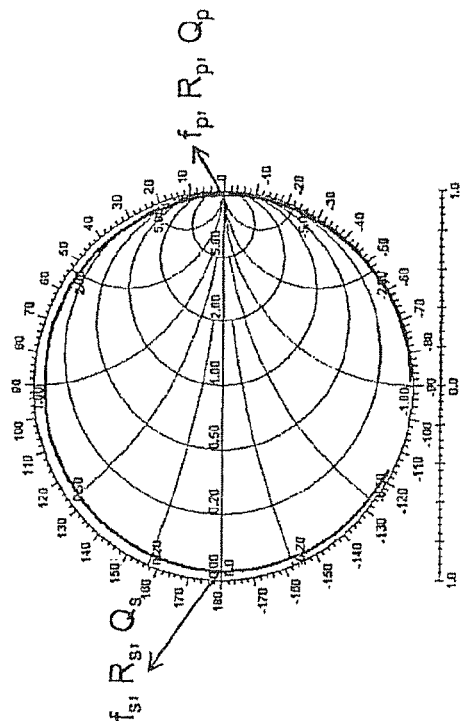
FIG. 19B A diagram of Smith chart of general thin-film piezoelectric resonator.

The ladder-type thin-film piezoelectric filter illustrated in FIG. 11 was produced using the thin-film piezoelectric resonators as described in the exemplary embodiment of FIG. 17 having the same conditions concerning the constituent layers as those set in Comparative Example 5.

The band-pass characteristics of the thin-film piezoelectric filter is illustrated in FIG. 16. As compared with the band-pass characteristics of the thin-film piezoelectric filters of Examples 29 and 30 which were produced using the thin-film piezoelectric resonators each having the frame layer 16, the insertion loss in the passband (1920 MHz to 1980 MHz) was increased.

TABLE 1

|  | Upper electrode material | Acoustic impedance Zu [× $10^7$ kg/m² * s] | Wt [μm] | θ [°] | Ws [μm] | Vibration region zoning layer |
|---|---|---|---|---|---|---|
| Example 1 | Ru | 8.6 | 3.0 | 20 | 0.27 | Frame layer |
| Example 2 | Ru | 8.6 | 3.0 | 30 | 0.17 | Frame layer |
| Example 3 | Ru | 8.6 | 3.0 | 45 | 0.10 | Frame layer |
| Example 4 | Ru | 8.6 | 3.0 | 60 | 0.06 | Frame layer |
| Example 5 | Ru | 8.6 | 3.0 | 70 | 0.04 | Frame layer |
| Comparative Example 1 | Ru | 8.6 | 3.0 | 90 | 0.00 | Frame layer |
| Example 6 | Ru | 8.6 | 1.5 | 45 | 0.10 | Frame layer |
| Example 7 | Ru | 8.6 | 1.5 | 60 | 0.06 | Frame layer |
| Comparative Example 2 | Ru | 8.6 | 1.5 | 90 | 0.00 | Frame layer |
| Example 8 | Ru | 8.6 | 4.0 | 45 | 0.10 | Frame layer |
| Example 9 | Ru | 8.6 | 4.0 | 60 | 0.06 | Frame layer |
| Comparative Example 3 | Ru | 8.6 | 4.0 | 90 | 0.00 | Frame layer |
| Example 10 | Ru | 8.6 | 6.0 | 45 | 0.10 | Frame layer |
| Example 11 | Ru | 8.6 | 6.0 | 60 | 0.06 | Frame layer |
| Comparative Example 4 | Ru | 8.6 | 6.0 | 90 | 0.00 | Frame layer |

TABLE 1-continued

|  |  |  |  |  |  |  |
|---|---|---|---|---|---|---|
| Example 12 | Ru | 8.6 | 3.0 | 45 | 0.10 | Frame layer*[1] |
| Example 13 | Ru | 8.6 | 3.0 | 45 | 0.12 | Upper electrode layer |
| Example 14 | Ru | 8.6 | 3.0 | 60 | 0.07 | Upper electrode layer |
| Example 15 | Ru | 8.6 | 3.0 | 70 | 0.04 | Upper electrode layer |
| Example 16 | Ru | 8.6 | 3.0 | 45 | 0.12 | Upper electrode layer*[1] |
| Example 17 | Ru | 8.6 | 3.0 | 45 | 0.12 | Lower electrode layer |
| Example 18 | Ru | 8.6 | 3.0 | 60 | 0.07 | Lower electrode layer |
| Example 19 | Ru | 8.6 | 3.0 | 70 | 0.04 | Lower electrode layer |
| Example 20 | Ru | 8.6 | 3.0 | 45 | 0.12 | Lower electrode layer*[1] |
| Example 21 | Ru | 8.6 | 3.0 | 45 | 0.20 | Frame layer |
| Example 22 | Ru | 8.6 | 3.0 | 60 | 0.12 | Frame layer |
| Example 23 | Ru | 8.6 | 3.0 | 45 | 0.10 | Frame layer |
| Example 24 | Ru | 8.6 | 3.0 | 60 | 0.06 | Frame layer |
| Example 25 | Ru | 8.6 | 3.0 | 45 | 0.10 | Frame layer |
| Example 26 | Ru | 8.6 | 3.0 | 60 | 0.06 | Frame layer |
| Example 27 | Ru | 8.6 | 3.0 | 45 | 0.08 | Frame layer |
| Example 28 | Ru | 8.6 | 3.0 | 60 | 0.05 | Frame layer |
| Comparative Example 5 | Ru | 8.6 | — | — | — | — |

|  | Vibration region zoning layer material | Thickness T [nm] | Young's modulus [×$10^{11}$ N/m$^2$] | Acoustic impedance Zf [× $10^7$ kg/m$^2$ * s] | Zf/Zu |
|---|---|---|---|---|---|
| Example 1 | Mo | 100 | 3.2 | 6.9 | 0.80 |
| Example 2 | Mo | 100 | 3.2 | 6.9 | 0.80 |
| Example 3 | Mo | 100 | 3.2 | 6.9 | 0.80 |
| Example 4 | Mo | 100 | 3.2 | 6.9 | 0.80 |
| Example 5 | Mo | 100 | 3.2 | 6.9 | 0.80 |
| Comparative Example 1 | Mo | 100 | 3.2 | 6.9 | 0.80 |
| Example 6 | Mo | 100 | 3.2 | 6.9 | 0.80 |
| Example 7 | Mo | 100 | 3.2 | 6.9 | 0.80 |
| Comparative Example 2 | Mo | 100 | 3.2 | 6.9 | 0.80 |
| Example 8 | Mo | 100 | 3.2 | 6.9 | 0.80 |
| Example 9 | Mo | 100 | 3.2 | 6.9 | 0.80 |
| Comparative Example 3 | Mo | 100 | 3.2 | 6.9 | 0.80 |
| Example 10 | Mo | 100 | 3.2 | 6.9 | 0.80 |
| Example 11 | Mo | 100 | 3.2 | 6.9 | 0.80 |
| Comparative Example 4 | Mo | 100 | 3.2 | 6.9 | 0.80 |
| Example 12 | Mo | 100 | 3.2 | 6.9 | 0.80 |
| Example 13 | Ru | 120 | 4.4 | — | — |
| Example 14 | Ru | 120 | 4.4 | — | — |
| Example 15 | Ru | 120 | 4.4 | — | — |
| Example 16 | Ru | 120 | 4.4 | — | — |
| Example 17 | Mo | 120 | 3.2 | — | — |
| Example 18 | Mo | 120 | 3.2 | — | — |
| Example 19 | Mo | 120 | 3.2 | — | — |
| Example 20 | Mo | 120 | 3.2 | — | — |
| Example 21 | Al | 200 | 0.7 | 1.7 | 0.20 |
| Example 22 | Al | 200 | 0.7 | 1.7 | 0.20 |
| Example 23 | Au | 100 | 0.8 | 7.0 | 0.81 |
| Example 24 | Au | 100 | 0.8 | 7.0 | 0.81 |
| Example 25 | W | 100 | 3.5 | 10.1 | 1.17 |
| Example 26 | W | 100 | 3.5 | 10.1 | 1.17 |
| Example 27 | Ir | 80 | 5.1 | 12.0 | 1.40 |
| Example 28 | Ir | 80 | 5.1 | 12.0 | 1.40 |
| Comparative Example 5 | — | — | — | — | — |

*[1]extend to buffer region and support region

TABLE 2

|  | Rs [Ω] | Qs | Rp [Ω] | Qp | Kt$^2$ [%] | Noise level |
|---|---|---|---|---|---|---|
| Example 1 | 1.4 | 1450 | 2600 | 1430 | 6.3 | Low |
| Example 2 | 1.5 | 1420 | 2650 | 1480 | 6.3 | Low |
| Example 3 | 1.5 | 1400 | 2740 | 1500 | 6.3 | Low |
| Example 4 | 1.5 | 1410 | 2610 | 1450 | 6.2 | Intermediate |
| Example 5 | 1.5 | 1400 | 2380 | 1420 | 6.2 | Intermediate |
| Comp. Example 1 | 1.5 | 1410 | 2060 | 1260 | 6.3 | High |
| Example 6 | 1.6 | 1380 | 2470 | 1430 | 6.3 | Low |
| Example 7 | 1.5 | 1390 | 2480 | 1430 | 6.3 | Low |
| Comp. Example 2 | 1.5 | 1400 | 2080 | 1270 | 6.3 | High |
| Example 8 | 1.5 | 1390 | 2400 | 1400 | 6.2 | Intermediate |
| Example 9 | 1.5 | 1410 | 2290 | 1370 | 6.2 | Intermediate |

TABLE 2-continued

|  | Rs [Ω] | Qs | Rp [Ω] | Qp | Kt² [%] | Noise level |
|---|---|---|---|---|---|---|
| Comp. Example 3 | 1.5 | 1420 | 2030 | 1260 | 6.2 | High |
| Example 10 | 1.5 | 1400 | 2300 | 1360 | 6.1 | Intermediate |
| Example 11 | 1.5 | 1390 | 2220 | 1330 | 6.1 | Intermediate |
| Comp. Example 4 | 1.5 | 1380 | 1880 | 1200 | 6.1 | High |
| Example 12 | 1.1 | 1580 | 2740 | 1500 | 6.3 | Low |
| Example 13 | 1.4 | 1390 | 2640 | 1450 | 6.2 | Low |
| Example 14 | 1.4 | 1370 | 2580 | 1430 | 6.2 | Intermediate |
| Example 15 | 1.4 | 1400 | 2330 | 1400 | 6.2 | Intermediate |
| Example 16 | 1.2 | 1530 | 2620 | 1450 | 6.2 | Low |
| Example 17 | 1.4 | 1370 | 2600 | 1440 | 6.2 | Low |
| Example 18 | 1.4 | 1400 | 2540 | 1450 | 6.2 | Intermediate |
| Example 19 | 1.5 | 1420 | 2330 | 1400 | 6.2 | Intermediate |
| Example 20 | 1.1 | 1590 | 2630 | 1420 | 6.2 | Low |
| Example 21 | 1.5 | 1400 | 2200 | 1330 | 6.2 | Low |
| Example 22 | 1.5 | 1420 | 2180 | 1320 | 6.2 | Intermediate |
| Example 23 | 1.4 | 1360 | 2220 | 1330 | 6.3 | Low |
| Example 24 | 1.5 | 1410 | 2190 | 1320 | 6.3 | Intermediate |
| Example 25 | 1.6 | 1370 | 2680 | 1480 | 6.0 | Low |
| Example 26 | 1.5 | 1410 | 2620 | 1450 | 6.1 | Intermediate |
| Example 27 | 1.6 | 1390 | 2420 | 1430 | 5.8 | Low |
| Example 28 | 1.6 | 1390 | 2400 | 1400 | 5.8 | Intermediate |
| Comp. Example 5 | 1.6 | 1330 | 1320 | 820 | 6.4 | low |

Examples 31 to 33

The thin-film piezoelectric resonators were produced in the same manner as Example 3 except that the size of the sacrificial layer was adjusted such that the width (W2 illustrated in FIG. 20A and the like) of the buffer region 46 was 2 μm and the major axis dimension a and minor axis dimension b of the bottom electrode 8 were set to 121 μm to 147 μm and 86 μm to 112 μm, respectively, i.e., the width (W1 illustrated in FIG. 20A and the like) of the support portion 18' was set to 5 μm to 18 μm. Table 3 illustrates conditions for carrying out Examples 31 to 33 and Table 4 illustrates the electrical characteristics of the obtained thin-film piezoelectric resonators.

As illustrated in Table 4, the impedances (Rp) of the obtained thin-film piezoelectric resonators at the antiresonance frequency were as high as 2480Ω to 2740Ω, and Q-values (Qp) were as high as 1430 to 1500. Further, as denoted by the noise level in Table 4, the noise levels in and around the frequency band from the resonance frequency to antiresonance frequency were "low". Thus, occurrence of noise was suppressed. In addition, breakage of the resonator during its manufacturing process was suppressed, and manufacturing yield was as high as 90% or more.

Comparative Examples 7 to 9

The thin-film piezoelectric resonators were produced in the same manner as Example 31 except that the widths (W1) of the support portion 18' were set to, −5 μm, 1 μm, and 20 μm, respectively. Table 3 illustrates conditions for carrying out Comparative Examples 7 to 9 and Table 4 illustrates the electrical characteristics of the obtained thin-film piezoelectric resonators. The W1 in the case where the outer peripheral edge of the bottom electrode exists inside the cavity as viewed in the thickness direction of the piezoelectric resonator stack has a minus sign.

As illustrated in Table 4, the impedances (Rp) of the obtained thin-film piezoelectric resonators at the antiresonance frequency were 1540Ω to 1760Ω, which were lower than those of Examples 31 to 33 and Q-values (Qp) were 980 to 1100, which were lower than those of Examples 31 to 33. Further, the noise levels in and around the frequency band from the resonance frequency to antiresonance frequency were "high" in Comparative Example 7 and "intermediate" in Comparative Example 8. Thus, the levels of the generated noise were increased as compared to those of Examples 31 to 33.

Examples 34 and 35

The thin-film piezoelectric resonators were produced in the same manner as Example 31 except that the widths (W2) of the buffer layer 46 were set to 1 μm and 3 μm, respectively. Table 3 illustrates conditions for carrying out Examples 34 and 35 and Table 4 illustrates the electrical characteristics of the obtained thin-film piezoelectric resonators.

As illustrated in Table 4, the impedances (Rp) of the obtained thin-film piezoelectric resonators at the antiresonance frequency were as high as 2410Ω and 2210Ω, and Q-values (Qp) were as high as 1400 and 1320. Further, as denoted by the noise level in Table 4, the noise levels in and around the frequency band from the resonance frequency to antiresonance frequency were "low". Thus, occurrence of noise was suppressed. In addition, breakage of the resonator during its manufacturing process was suppressed, and manufacturing yield was as high as 91% or more.

Comparative Examples 10 and 11

The thin-film piezoelectric resonators were produced in the same manner as Example 31 except that the widths (W2) of the buffer region 46 were set to 0 μM and 4 μm, respectively. Table 3 illustrates conditions for carrying out Comparative Examples 10 and 11 and Table 4 illustrates the electrical characteristics of the obtained thin-film piezoelectric resonators.

As illustrated in Table 4, the impedances (Rp) of the obtained thin-film piezoelectric resonators at the antiresonance frequency were 1460Ω and 1750Ω, which were lower than those of Examples 34 and 35 and Q-values (Qp) were 960 and 1090, which were lower than those of Examples 34 and 35. The values of kt² were 5.9% and 6.0%, which were lower than those of Examples 34 and 35. Further, the noise level in and around the frequency band from the resonance frequency to antiresonance frequency was "intermediate" in Comparative Example 11. Thus, the level of the generated noise was increased as compared to those of Examples 34 and 35. Further, in Comparative example 11, breakage of the resonator occurred during manufacturing process, and the manufacturing yield was unfavorably reduced to 80%.

TABLE 3

|  | Wt [μm] | Θ [°] | Ws [μm] | W1 [μm] | W2 [μm] | T [μm] | W1/t | W2/t |
|---|---|---|---|---|---|---|---|---|
| Example 31 | 3.0 | 45 | 0.10 | 5 | 2 | 1.8 | 2.78 | 1.11 |
| Example 32 | 3.0 | 45 | 0.10 | 10 | 2 | 1.8 | 5.56 | 1.11 |
| Example 33 | 3.0 | 45 | 0.10 | 18 | 2 | 1.8 | 10.00 | 1.11 |
| Comp. Example 7 | 3.0 | 45 | 0.10 | −5 | 2 | 1.8 | −2.78 | 1.11 |
| Comp. Example 8 | 3.0 | 45 | 0.10 | 1 | 2 | 1.8 | 0.56 | 1.11 |
| Comp. Example 9 | 3.0 | 45 | 0.10 | 20 | 2 | 1.8 | 11.11 | 1.11 |
| Example 34 | 3.0 | 45 | 0.10 | 5 | 1 | 1.8 | 2.78 | 0.56 |
| Example 35 | 3.0 | 45 | 0.10 | 5 | 3 | 1.8 | 2.78 | 1.67 |
| Comp. Example 10 | 3.0 | 45 | 0.10 | 5 | 0 | 1.8 | 2.78 | 0.00 |
| Comp. Example 11 | 3.0 | 45 | 0.10 | 5 | 4 | 1.8 | 2.78 | 2.22 |

TABLE 4

|  | Rs [Ω] | Qs | Rp [Ω] | Qp | kt² [%] | Noise level | Manufacturing yield [%] |
|---|---|---|---|---|---|---|---|
| Example 31 | 1.5 | 1400 | 2740 | 1500 | 6.3 | Low | 90 |
| Example 32 | 1.5 | 1410 | 2650 | 1460 | 6.3 | Low | 92 |
| Example 33 | 1.6 | 1380 | 2480 | 1430 | 6.3 | Low | 92 |
| Comp. Example 7 | 1.7 | 1220 | 1680 | 1030 | 6.2 | High | 8 |
| Comp. Example 8 | 1.7 | 1260 | 1760 | 1100 | 6.3 | Intermediate | 22 |
| Comp. Example 9 | 1.4 | 1440 | 1540 | 980 | 6.3 | Low | 93 |
| Example 34 | 1.5 | 1400 | 2410 | 1400 | 6.2 | Low | 92 |
| Example 35 | 1.5 | 1410 | 2210 | 1320 | 6.2 | Low | 91 |
| Comp. Example 10 | 1.4 | 1430 | 1460 | 960 | 5.9 | Low | 92 |
| Comp. Example 11 | 1.5 | 1390 | 1750 | 1090 | 6.0 | Intermediate | 80 |

Examples 36 to 39

Figure 25:
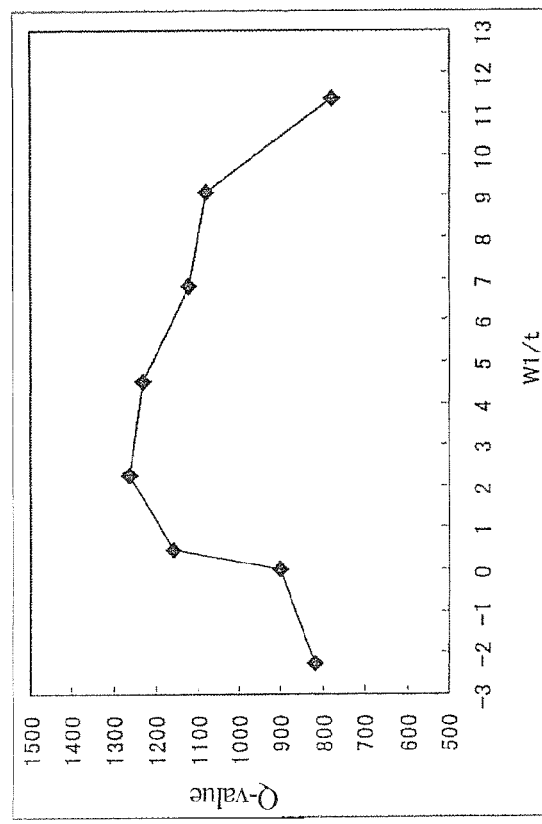
FIG. 25 A diagram showing Q-value of the thin-film piezoelectric resonators produced in Examples 36 to 39 and Comparative Examples 12 to 15.

The thin-film piezoelectric resonators as described in the exemplary embodiment of FIGS. 20A to 20C were produced. The shape of the top electrode 10, i.e., the shape of the vibration region 16' was an ellipse with the major axis dimension a of 180 μm and the minor axis dimension b of 140 μm. However, the frame layer 16 was not formed, and the pair of the bottom electrode 8 and its external connection conductor 814 and pair of the top electrode 10 and its external connection conductor 1014 each had the uniform thickness in the vibration region 16', buffer region 20', and support region 17. According to the present example, the material and thickness of each constitutional layer were set as follows: the bottom electrode 8 and external connection conductor 814 were made of Mo with a thickness of 300 nm; the piezoelectric layer 2 was made of AlN with a thickness of 1700 nm; and the top electrode 10 and external connection conductor 1014 were made of Mo with a thickness of 200 nm, that is, the thickness t of the piezoelectric resonator stack 12 in the vibration region 16' was set to 2.2 μm. FIG. 25 and Table 5 illustrate the relationship among the width w1 of the bottom electrode support portion 18' and effective kt² and Q-value of the thin-film piezoelectric resonator in the case where the width w2 of the buffer region 20' was set to 2 μm (w2/t=0.91). As is clear from FIG. 25 and Table 5, in the range of 2.17≤w1/t≤10, the Q-value was high, thus exhibiting satisfactory resonator characteristics, breakage of the resonator during its manufacturing process was suppressed, and the manufacturing yield was as very high as 90% or more.

Comparative Examples 12 to 15

The thin-film piezoelectric resonators were produced in the same manner as Example 36 except that the widths w1 of the bottom electrode support portion 18' were set to values listed in Table 5. The results are illustrated in FIG. 25 and Table 5. The w1 in the case where the outer peripheral edge of the bottom electrode exists inside the cavity as viewed in the thickness direction of the piezoelectric resonator stack has a minus sign. As is clear from FIG. 25 and Table 5, in the thin-film piezoelectric resonators produced under the same conditions as those in Example 36 and a condition of w1/t>10, the Q-value was unfavorably low. Further, in the thin-film piezoelectric resonator produced under the same conditions as those in Example 36 and a condition of w1/t<2.17, the Q-value was unfavorably low, and breakage of the resonator occurred during the manufacturing process, thus unfavorably reducing the manufacturing yield.

Examples 40 to 42

Figure 26:
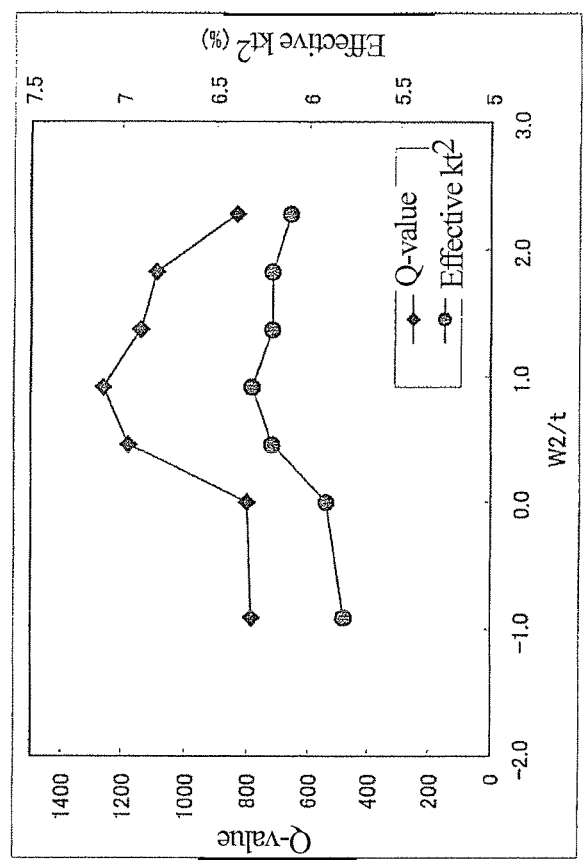
FIG. 26 A diagram showing Q-value and effective $kt^2$ of the thin-film piezoelectric resonators produced in Examples 40 to 42 and Comparative Examples 12 and 16 to 18.

The thin-film piezoelectric resonators as described in the exemplary embodiment of FIGS. 20A to 20C were produced. The shape of the top electrode 10, i.e., the shape of the vibration region 16' was an ellipse with the major axis dimension a of 180 μm and the minor axis dimension b of 140 μm. The material and thickness of each constitutional layer were set to the same values as Example 36. FIG. 26 and Table 5 illustrate the relationship among the width w2 of the buffer region 20' and effective kt² and Q-value of the thin-film piezoelectric resonator in the case where the width w1 of the bottom electrode support portion 18' was set to 5 μm (w1/t=2.27). As is clear from FIG. 26 and Table 5, in the range of 0.25≤w2/t≤2, the effective kt² and Q-value were high, thus exhibiting satisfactory resonator characteristics. In addition, breakage of the resonator during its manufacturing process was suppressed, and manufacturing yield was as very high as 90% or more.

Comparative Examples 16 to 18

The thin-film piezoelectric resonators were produced in the same manner as Example 40 except that the widths w2 of the buffer region were set to values listed in Table 5. The results are illustrated in FIG. 26 and table 5. The widths w2 in the case where the cavity exists inside the outer peripheral edge of the top electrode as viewed in the thickness direction of the piezoelectric resonator stack has a minus sign. As is clear from FIG. 26 and Table 5, in the thin-film piezoelectric resonator produced under the same conditions as those in Example 40 and a condition of w2/t<0.25 or w2/t>2, the effective kt² or Q-value was unfavorably low.

Examples 43 to 46

The thin-film piezoelectric resonators as described in the exemplary embodiment of FIGS. 20A to 20C were produced. The shape of the top electrode 10, i.e., the shape of the vibration region 16' was an ellipse, and the major axis dimension a and minor axis dimension b of the ellipse was set as follows: a=195 μm, b=130 μm (a/b=1.50) a=210 μm, b=120 μm (a/b=1.75), a=220 μm, b=115 μm (a/b=1.91), or a=230 μm, b=110 μm (a/b=2.09). The width w1 of the bottom electrode support portion 18' was set to 5 μm, and width w2 of the buffer region 20' was set to 2 μm. The material and thickness of each constitutional layer were set to the same values as Example 36. The results are illustrated in Table 5. As is clear from Table 5, in the range of 1<a/b≤1.9, thin-film piezoelectric resonators having a larger effective kt² and a higher Q-value were favorably obtained. In addition, breakage of the resonator during its manufacturing process was suppressed, and manufacturing yield was as high as 80% or more.

Example 47

The thin-film piezoelectric resonator as described in the exemplary embodiment illustrated in FIGS. 24A and 24B was produced using the lower dielectric layer 24 and upper dielectric layer 26 both made of AlN with a thickness of 0.05 μm. The constituent layers of the piezoelectric resonator stack 12 other than the lower dielectric layer 24 and upper dielectric layer 26 were formed in the same manner as those in Example 36. The results are illustrated in Table 5. The obtained thin-film piezoelectric resonator had a large effective $kt^2$ and a high Q-value and, thus, it was possible to obtain a thin-film piezoelectric resonator having excellent characteristics even in the case where the lower dielectric layer 24 and upper dielectric layer 26 were added. In addition, breakage of the resonator during its manufacturing process was suppressed, and manufacturing yield was as considerably high as 97%.

TABLE 5

| | Ellipse major axis a [μm] | Ellipse minor axis b [μm] | a/b | Thickness t [μm] | W1 [μm] | W1/t | W2 [μm] | W2/t | Manufacturing yield [%] | Effective $Kt^2$ [%] | Q-value |
|---|---|---|---|---|---|---|---|---|---|---|---|
| Example 36 | 180 | 140 | 1.29 | 2.2 | 5 | 2.27 | 2 | 0.91 | 90 | 6.3 | 1260 |
| Example 37 | 180 | 140 | 1.29 | 2.2 | 10 | 4.55 | 2 | 0.91 | 94 | 6.3 | 1230 |
| Example 38 | 180 | 140 | 1.29 | 2.2 | 15 | 6.82 | 2 | 0.91 | 93 | 6.3 | 1120 |
| Example 39 | 180 | 140 | 1.29 | 2.2 | 20 | 9.09 | 2 | 0.91 | 93 | 6.3 | 1080 |
| Comp. Ex. 12 | 180 | 140 | 1.29 | 2.2 | −5 | −2.27 | 2 | 0.91 | 11 | 6.2 | 820 |
| Comp. Ex. 13 | 180 | 140 | 1.29 | 2.2 | 0 | 0.00 | 2 | 0.91 | 15 | 6.3 | 900 |
| Comp. Ex. 14 | 180 | 140 | 1.29 | 2.2 | 1 | 0.45 | 2 | 0.91 | 25 | 6.3 | 1160 |
| Comp. Ex. 15 | 180 | 140 | 1.29 | 2.2 | 25 | 11.36 | 2 | 0.91 | 93 | 6.3 | 780 |
| Example 40 | 180 | 140 | 1.29 | 2.2 | 5 | 2.27 | 1 | 0.45 | 92 | 6.2 | 1180 |
| Example 41 | 180 | 140 | 1.29 | 2.2 | 5 | 2.27 | 3 | 1.36 | 94 | 6.2 | 1140 |
| Example 42 | 180 | 140 | 1.29 | 2.2 | 5 | 2.27 | 4 | 1.82 | 91 | 6.2 | 1090 |
| Comp. Ex. 16 | 180 | 140 | 1.29 | 2.2 | 5 | 2.27 | −2 | −0.91 | 93 | 5.8 | 780 |
| Comp. Ex. 17 | 180 | 140 | 1.29 | 2.2 | 5 | 2.27 | 0 | 0.00 | 92 | 5.9 | 800 |
| Comp. Ex. 18 | 180 | 140 | 1.29 | 2.2 | 5 | 2.27 | 5 | 2.27 | 88 | 6.1 | 830 |
| Example 43 | 195 | 130 | 1.50 | 2.2 | 5 | 2.27 | 2 | 0.91 | 92 | 6.2 | 1140 |
| Example 44 | 210 | 120 | 1.75 | 2.2 | 5 | 2.27 | 2 | 0.91 | 90 | 6.2 | 1060 |
| Example 45 | 220 | 115 | 1.91 | 2.2 | 5 | 2.27 | 2 | 0.91 | 88 | 6.2 | 1000 |
| Example 46 | 230 | 110 | 2.09 | 2.2 | 5 | 2.27 | 2 | 0.91 | 82 | 6.1 | 960 |
| Example 47 | 180 | 140 | 1.29 | 2.3 | 5 | 2.17 | 2 | 0.87 | 97 | 6.3 | 1220 |

REFERENCE SIGNS LIST

2 Piezoelectric layer
4 Air gap (cavity, vibration space)
6 Substrate
7 Insulating layer
8 Bottom electrode
814 External connection conductor
10 Top electrode
1014 External connection conductor
12 Piezoelectric resonator stack
14 Connection conductor
16 Frame layer
16' Vibration region
17 Support region
18 Lower dielectric layer
18' Support portion of bottom electrode
20 Upper dielectric layer
20' Buffer region
22 Acoustic reflection layer
22' Cavity region
24 Lower dielectric layer
26 Upper dielectric layer
30 Through hole for sacrificial layer etching
40 Vibration region
41 First vibration region
42 Second vibration region
43 Third vibration region
46 Buffer region
48 Support region
50 Film layer
60 Frame-like zone
70 Resist film
104, 106 Input/output port
131, 133, 135, 137 Series thin-film piezoelectric resonator of ladder-type filter
132, 134, 136, 138 Parallel thin-film piezoelectric resonator of ladder-type filter
141, 143 Series thin-film piezoelectric resonator of lattice-type filter
142, 144 Parallel thin-film piezoelectric resonator of lattice-type filter

The invention claimed is:

1. A thin-film piezoelectric resonator comprising:
a substrate;
a piezoelectric resonator stack formed on the substrate and having a piezoelectric layer and top and bottom electrodes formed so as to face each other through the piezoelectric layer; and
a cavity or an acoustic reflection layer formed between the substrate and piezoelectric resonator stack,
the piezoelectric resonator stack having a vibration region where the top and bottom electrodes overlap each other as viewed in the thickness direction of the piezoelectric resonator stack,
the vibration region including a first vibration region, a second vibration region, and a third vibration region,
as viewed in the thickness direction of the piezoelectric resonator stack, the first vibration region being located at the outermost side, the third vibration region being located at the innermost side and not contacting with the first vibration region, and the second vibration region being interposed between the first vibration region and third vibration region,
the resonance frequency of the primary thickness longitudinal vibration of the vibration region being $f_1$ in the first vibration region, being $f_2$ in the third vibration region, wherein $f_1$ and $f_2$ satisfy a relationship of $f_1 < f_2$, and being a value between $f_1$ and $f_2$ in the second vibration region, the value increasing from the outer portion contacting the first vibration region to the inner portion contacting the third vibration region, the piezoelectric resonator stack having a support region located outside the vibration region as viewed in the thickness direction of the piezoelectric resonator stack and a buffer region located between the vibration region and support region as viewed in the same direction, and contacting the substrate in the support region, the bottom electrode having, in the support region, a support portion extending along the boundary between the support region and buffer region, and the width w1 of the support portion and thickness t of the piezoelectric resonator stack in the vibration region satisfying a relationship of $2.17 \leq w1/t \leq 10$, and the width w2 of the buffer region and thickness t of the piezoelectric resonator stack in the vibration region satisfying a relationship of $0.25 \leq w2/t \leq 2$.

2. The thin-film piezoelectric resonator according to claim 1, wherein the piezoelectric resonator stack has different thicknesses in the first vibration region, second vibration region, and third vibration region.

3. The thin-film piezoelectric resonator according to claim 2, wherein the piezoelectric resonator stack has a frame layer additionally formed on the top electrode in the outer peripheral portion of the vibration region.

4. The thin-film piezoelectric resonator according to claim 3, wherein the frame layer is reduced in thickness, in the second vibration region, from the outer part contacting the first vibration region toward the inner part contacting the third vibration region.

5. The thin-film piezoelectric resonator according to claim 4, wherein the frame layer has a sloped upper surface in the second vibration region, and the angle of the sloped upper surface with respect to the upper surface of the substrate is 60° or less.

6. The thin-film piezoelectric resonator according to claim 3, wherein the frame layer is formed of a material having a Young's modulus of $1.0 \times 10^{11}$ N/m$^2$ or more.

7. The thin-film piezoelectric resonator according to claim 3, wherein $Z_f$ and $Z_u$ satisfy a relationship of $0.5Z_u < Z_f < 2Z_u$, where $Z_f$ is the acoustic impedance of the material of the frame layer, and $Z_u$ is the acoustic impedance of the material of the top electrode.

8. The thin-film piezoelectric resonator according to claim 2, wherein the top electrode or bottom electrode is reduced in thickness, in the second vibration region, from the outer part contacting the first vibration region toward the inner part contacting the third vibration region.

9. The thin-film piezoelectric resonator according to claim 8, wherein the top electrode or bottom electrode has a sloped upper surface in the second vibration region, and the angle of the sloped upper surface with respect to the upper surface of the substrate is 60° or less.

10. The thin-film piezoelectric resonator according to claim 1, wherein the top electrode or bottom electrode is formed of a material having a Young's modulus of $1.0 \times 10^{11}$ N/m$^2$ or more.

11. The thin-film piezoelectric resonator according to claim 1, wherein the width of the first vibration region is 3 μm or less.

12. The thin-film piezoelectric resonator according to claim 1, wherein the piezoelectric layer is formed of aluminum nitride.

13. The thin-film piezoelectric resonator according to claim 1, wherein the vibration region exists inside the outer peripheral edge of the cavity or acoustic reflection layer as viewed in the thickness direction of the piezoelectric resonator stack.

14. The thin-film piezoelectric resonator according to claim 1, wherein the piezoelectric resonator stack has a frame layer additionally formed on the top electrode in the outer peripheral portion of the vibration region and the frame layer has a uniform thickness in the first vibration region, the buffer region and the support region.

15. The thin-film piezoelectric resonator according to claim 1, wherein the support portion of the bottom electrode is formed so as not to overlap the top electrode and an external connection conductor connected to the top electrode as viewed in the thickness direction of piezoelectric resonator stack.

16. The thin-film piezoelectric resonator according to claim 1, wherein the vibration region has an ellipse shape.

17. The thin-film piezoelectric resonator according to claim 16, wherein the major axis dimension a and minor axis dimension b of the ellipse satisfy a relationship of $1 < a/b \leq 1.9$.

18. The thin-film piezoelectric resonator according to claim 1, wherein the piezoelectric resonator stack has a dielectric layer formed of at least one material selected from a group consisting of AlN, AlON, $Si_3N_4$ and SiAlON on the top electrode and/or under the bottom electrode.

19. A thin-film piezoelectric filter using the thin-film piezoelectric resonator as set forth in claim 1.

20. A thin-film piezoelectric filter of ladder-type or lattice-type in which series thin-film piezoelectric resonators and parallel thin-film piezoelectric resonators are connected in a ladder or lattice pattern, a thin-film piezoelectric resonator being used only as the parallel thin-film piezoelectric resonators, the thin-film piezoelectric resonator comprising:
    a substrate;
    a piezoelectric resonator stack formed on the substrate and having a piezoelectric layer and top and bottom electrodes formed so as to face each other through the piezoelectric layer; and
    a cavity or an acoustic reflection layer formed between the substrate and piezoelectric resonator stack,
    the piezoelectric resonator stack having a vibration region where the top and bottom electrodes overlap each other as viewed in the thickness direction of the piezoelectric resonator stack,
    the vibration region including a first vibration region, a second vibration region, and a third vibration region,
    as viewed in the thickness direction of the piezoelectric resonator stack, the first vibration region being located at the outermost side, the third vibration region being located at the innermost side and not contacting with the first vibration region, and the second vibration region being interposed between the first vibration region and third vibration region,
    the resonance frequency of the primary thickness longitudinal vibration of the vibration region being $f_1$ in the first vibration region, being $f_2$ in the third vibration region, wherein $f_1$ and $f_2$ satisfy a relationship of $f_1 < f_2$, and being a value between $f_1$ and $f_2$ in the second vibration region, the value increasing from the outer portion contacting the first vibration region to the inner portion contacting the third vibration region.

* * * * *